(12) United States Patent
Lee et al.

(10) Patent No.: US 12,451,359 B2
(45) Date of Patent: Oct. 21, 2025

(54) FLUORINE INCORPORATION METHOD FOR NANOSHEET

(71) Applicant: Taiwan Semiconductor Manufacturing Co., Ltd., Hsinchu (TW)

(72) Inventors: Hsin-Yi Lee, Hsinchu (TW); Mao-Lin Huang, Hsinchu (TW); Lung-Kun Chu, New Taipei (TW); Huang-Lin Chao, Hillsboro, OR (US); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/412,173

(22) Filed: Jan. 12, 2024

(65) Prior Publication Data
US 2024/0177996 A1    May 30, 2024

Related U.S. Application Data

(63) Continuation of application No. 17/378,017, filed on Jul. 16, 2021, now Pat. No. 11,915,937.
(Continued)

(51) Int. Cl.
*H01L 21/28*    (2025.01)
*H01L 21/3115*    (2006.01)
(Continued)

(52) U.S. Cl.
CPC .... *H01L 21/28158* (2013.01); *H01L 21/3115* (2013.01); *H10D 30/031* (2025.01);
(Continued)

(58) Field of Classification Search
CPC ........... H01L 21/28158; H01L 21/3115; H01L 21/28185; H01L 21/3105; H10D 30/031;
(Continued)

(56) References Cited

U.S. PATENT DOCUMENTS 9,209,247 B2    12/2015    Colinge et al.
9,236,267 B2    1/2016    De et al.
(Continued)

FOREIGN PATENT DOCUMENTS

CN    106972049 A    7/2017
CN    112687623 A    4/2021
(Continued)

*Primary Examiner* — Tong-Ho Kim
(74) *Attorney, Agent, or Firm* — Slater Matsil, LLP

(57) ABSTRACT

A method includes forming a plurality of nanostructures over a substrate; etching the plurality of nanostructures to form recesses; forming source/drain regions in the recesses; removing first nanostructures of the plurality of nanostructures leaving second nanostructures of the plurality of nanostructures; depositing a gate dielectric over and around the second nanostructures; depositing a protective material over the gate dielectric; performing a fluorine treatment on the protective material; removing the protective material; depositing a first conductive material over the gate dielectric; and depositing a second conductive material over the first conductive.

20 Claims, 53 Drawing Sheets

Related U.S. Application Data

(60) Provisional application No. 63/181,595, filed on Apr. 29, 2021.

(51) Int. Cl.
| | |
|---|---|
| *H01L 27/092* | (2006.01) |
| *H01L 29/40* | (2006.01) |
| *H01L 29/423* | (2006.01) |
| *H01L 29/66* | (2006.01) |
| *H10D 30/01* | (2025.01) |
| *H10D 64/01* | (2025.01) |
| *H10D 84/85* | (2025.01) |
| *H10D 30/67* | (2025.01) |

(52) U.S. Cl.
CPC ............. *H10D 64/01* (2025.01); *H10D 84/85* (2025.01); *H10D 30/014* (2025.01); *H10D 30/6735* (2025.01); *H10D 64/015* (2025.01); *H10D 64/018* (2025.01)

(58) Field of Classification Search
CPC ...... H10D 64/01; H10D 84/85; H10D 30/014; H10D 30/6735; H10D 64/015; H10D 64/018; H10D 30/6757; H10D 64/017; H10D 62/121; H10D 64/667; H10D 64/685; H10D 84/0181; H10D 84/038; H10D 64/514; H10D 84/0144; H10D 84/0158; H10D 84/834; H10D 62/118

USPC ......................................................... 438/283
See application file for complete search history.

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,960,053 B2 | 5/2018 | Hou et al. | |
| 10,468,258 B1 | 11/2019 | Lin et al. | |
| 11,049,937 B2 | 6/2021 | Cheng et al. | |
| 11,355,363 B2 | 6/2022 | Liaw | |
| 2012/0261758 A1 | 10/2012 | Lee et al. | |
| 2019/0096681 A1 | 3/2019 | Wei et al. | |
| 2020/0020690 A1 | 1/2020 | Ando et al. | |
| 2020/0135868 A1 | 4/2020 | Han et al. | |
| 2020/0135915 A1* | 4/2020 | Savant | H10D 30/024 |
| 2021/0057550 A1* | 2/2021 | Cheng | H10D 30/024 |

FOREIGN PATENT DOCUMENTS

| | | |
|---|---|---|
| TW | 202002011 A | 1/2020 |
| TW | 202109678 A | 3/2021 |

* cited by examiner

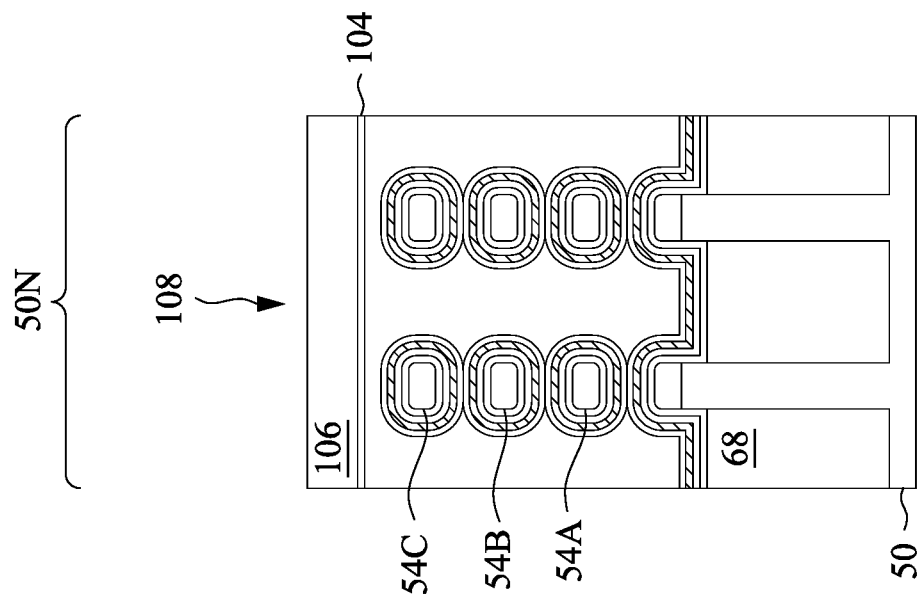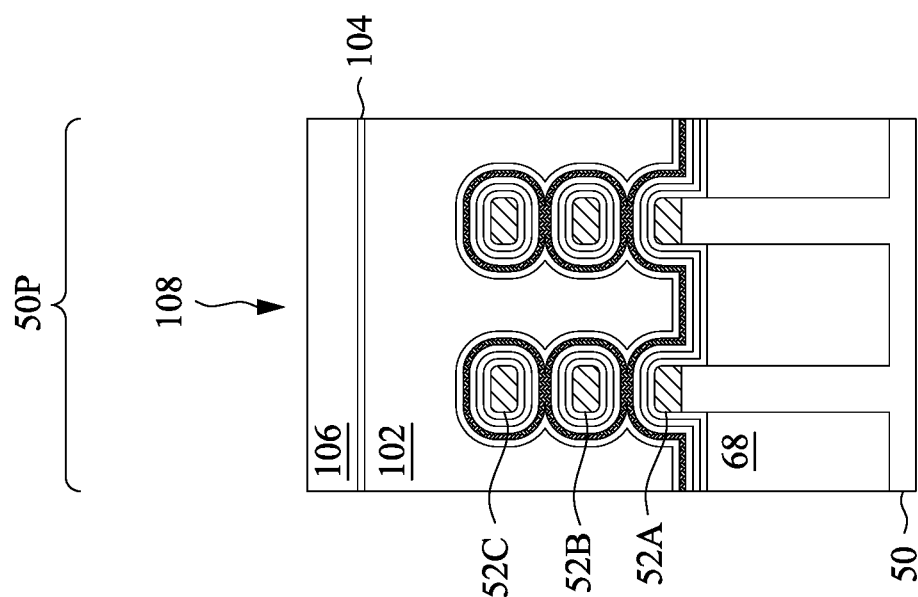
Figure 27A

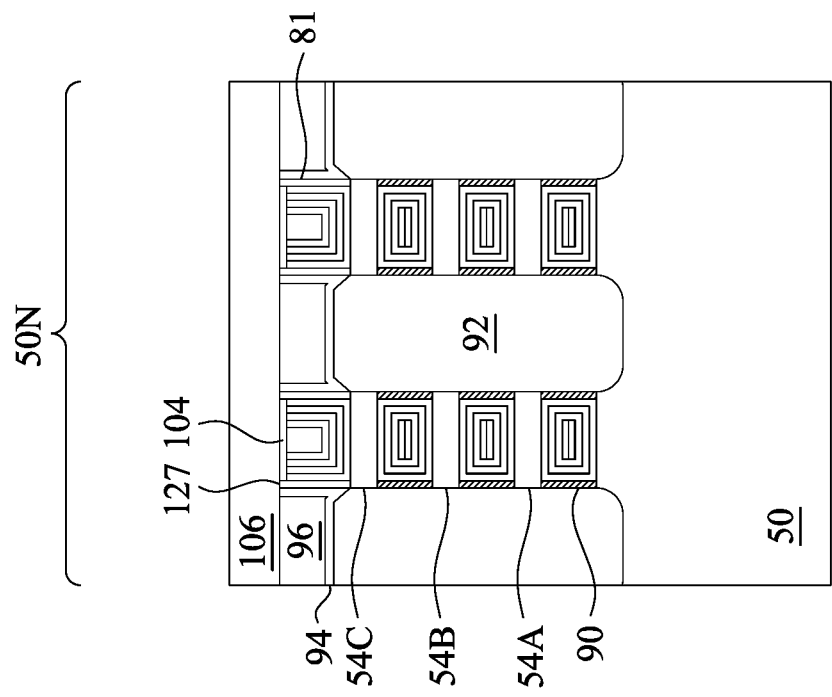
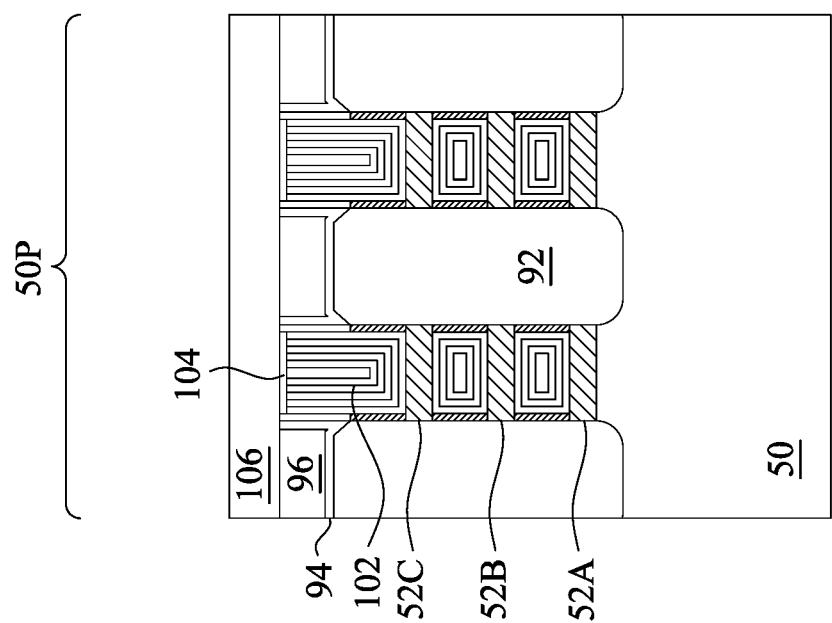
Figure 27B

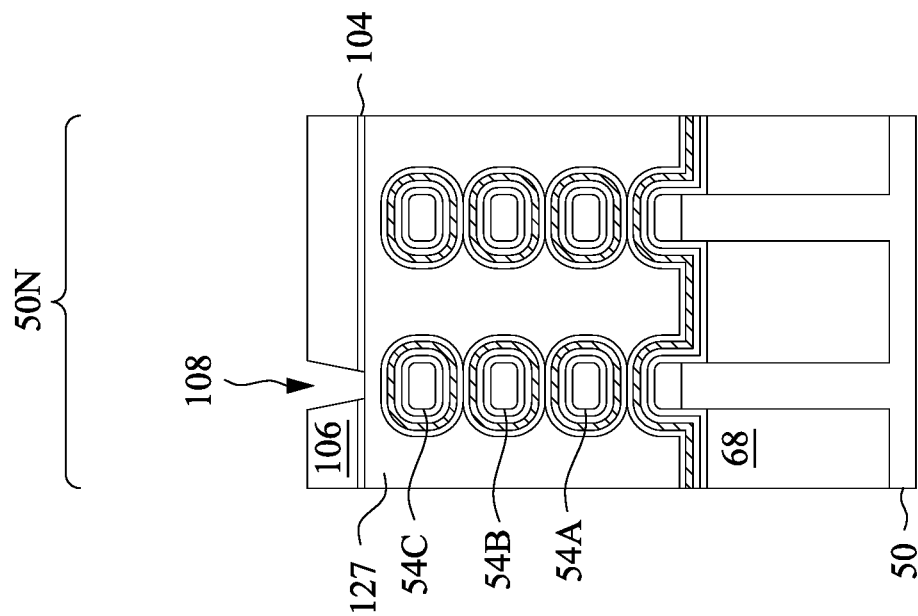
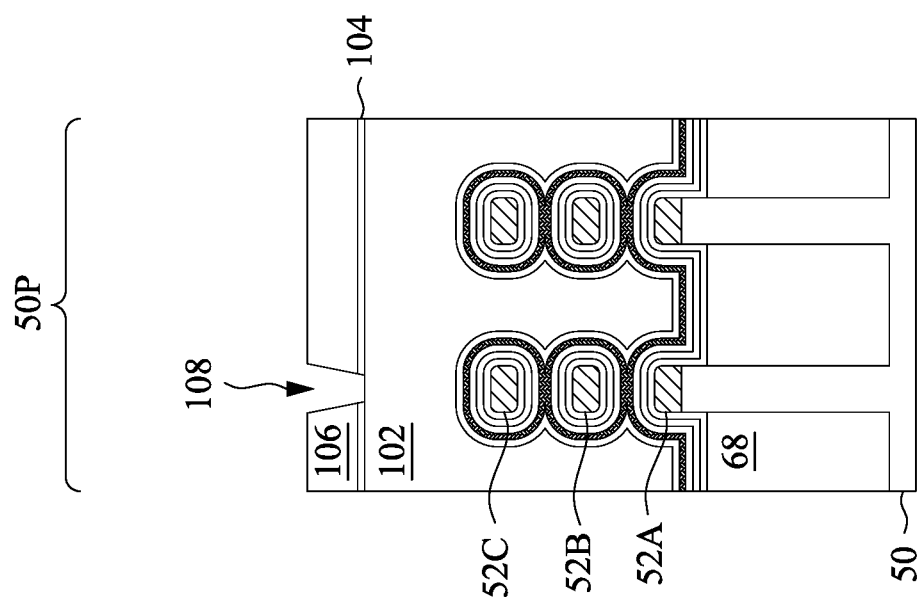
Figure 28A

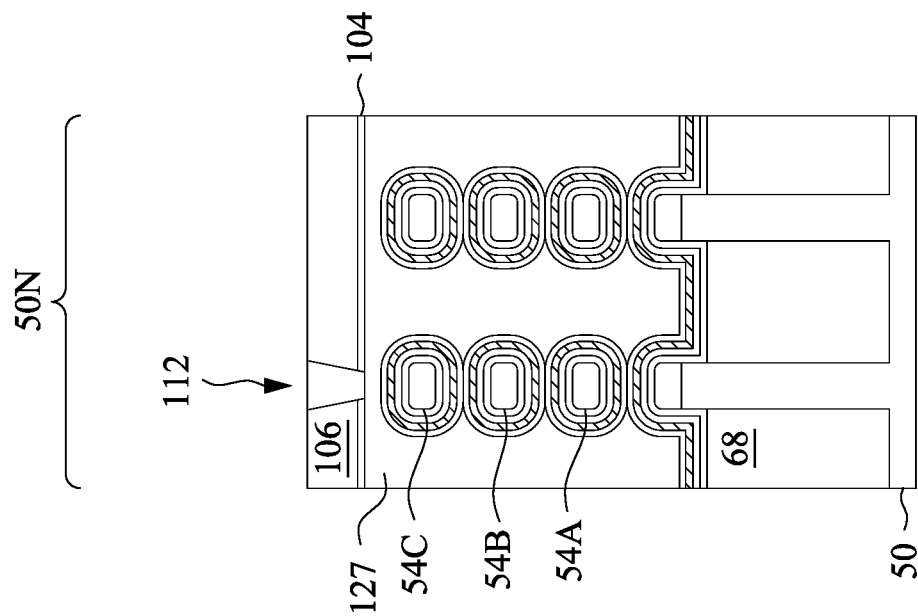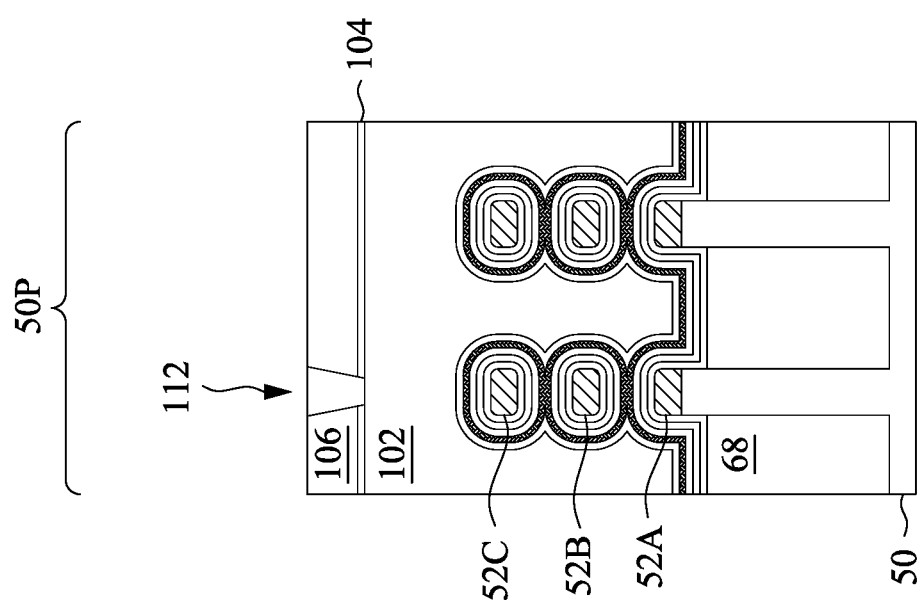
Figure 29A

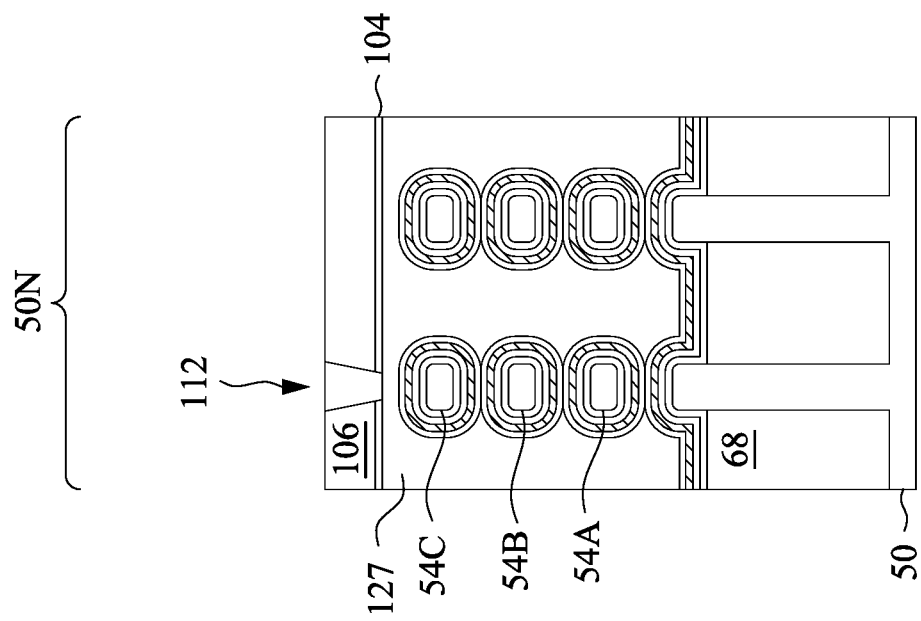
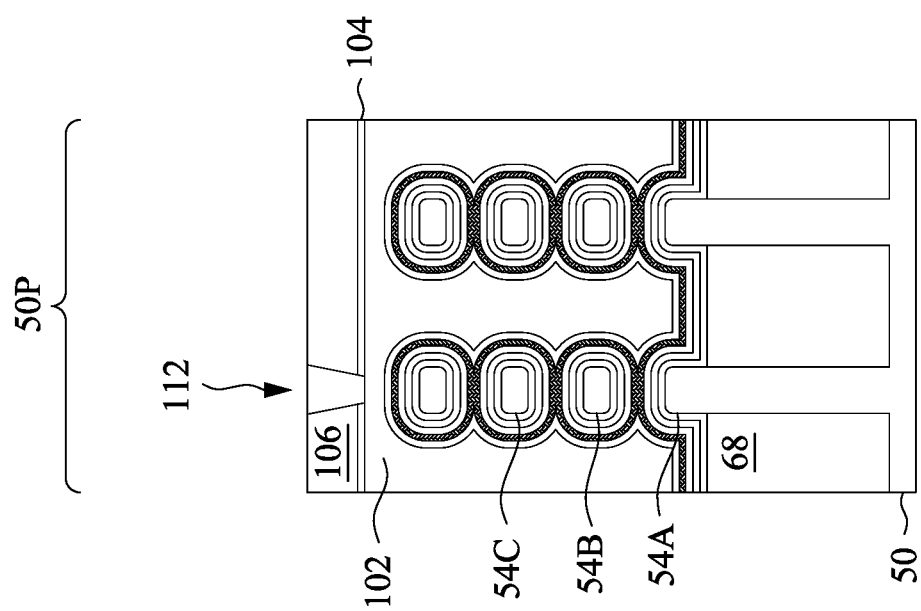
Figure 30A

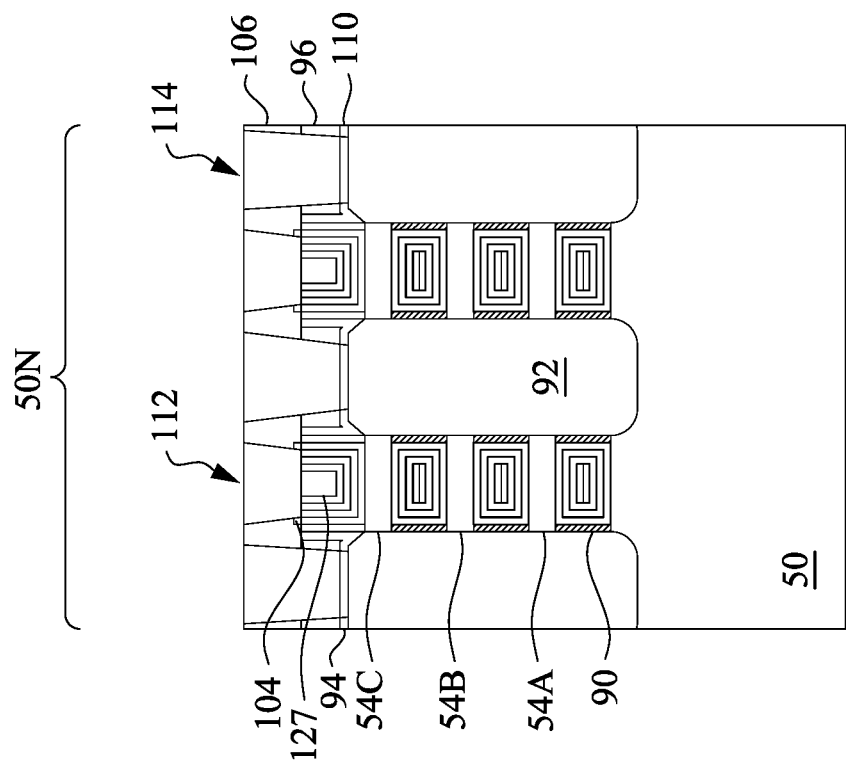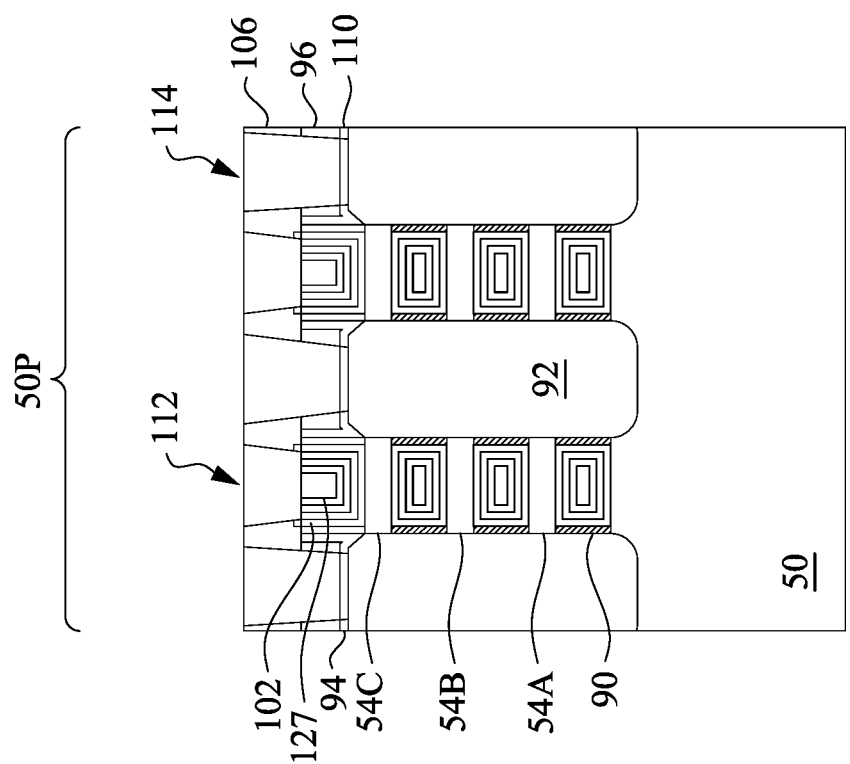
Figure 30B

FLUORINE INCORPORATION METHOD FOR NANOSHEET

PRIORITY CLAIM AND CROSS-REFERENCE

This application is a continuation of U.S. patent application Ser. No. 17/378,017, filed on Jul. 16, 2021, entitled "Fluorine Incorporation Method for Nanosheet," which claims the benefit of U.S. Provisional Application No. 63/181,595, filed on Apr. 29, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B 8A, 8B, 9A, 9B, 10A, 10B, 11A, 11B, 11C, 12A, 12B, 12C, 12D, 13A, 13B, 13C, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25A, 25B, 25C, 25D, 26A, 26B, 27A, 27B, 27C, 28A, 28B, 28C, 29A, 29B, and 29C are cross-sectional views of intermediate stages in the manufacturing of nano-FETs, in accordance with some embodiments.

FIGS. 30A, 30B, and 30C are cross-sectional views of a nano-FET, in accordance with some embodiments.

DETAILED DESCRIPTION

Figure 1:
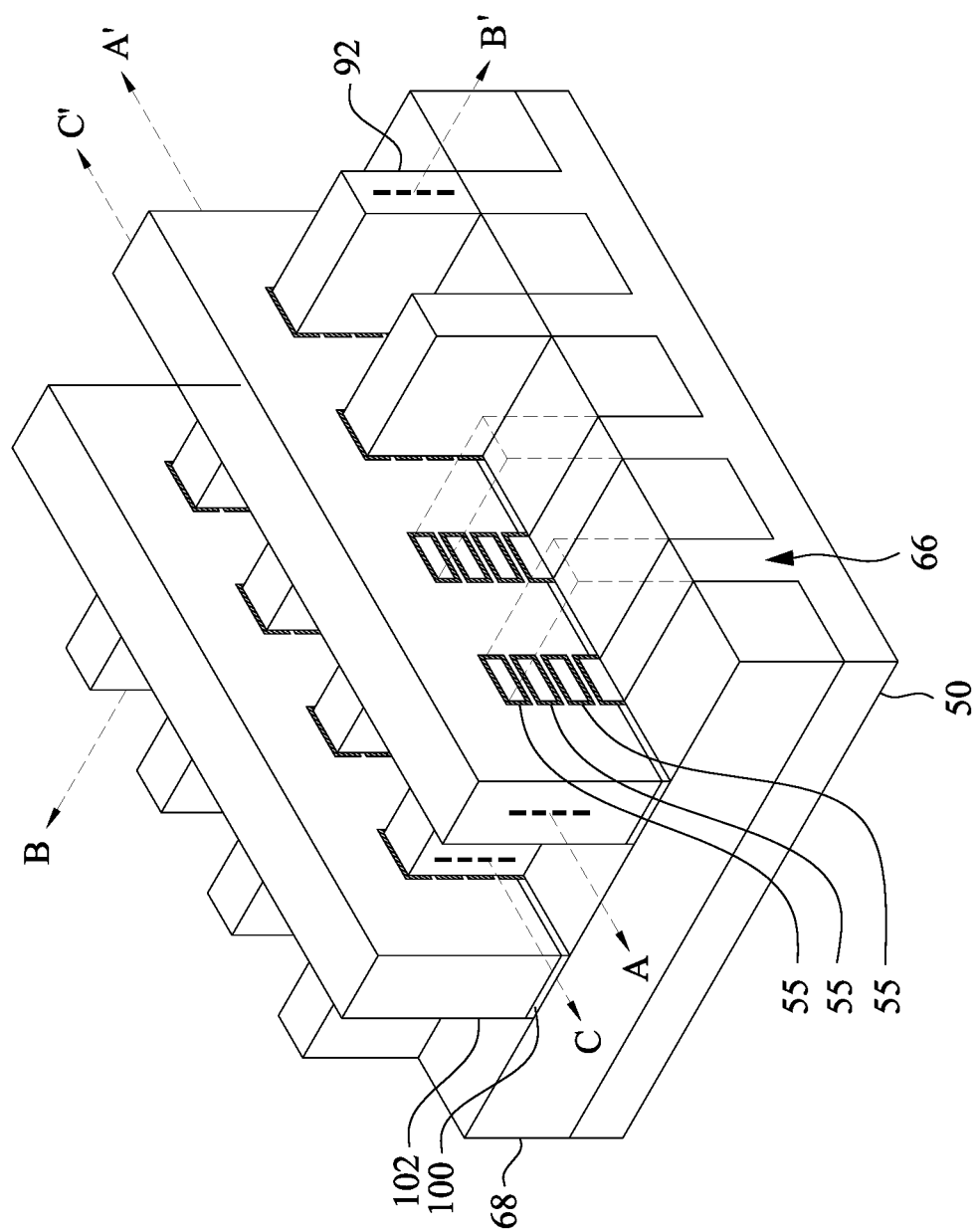
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Various embodiments provide gate stacks having fluorine treated gate dielectrics (e.g., an interfacial layer and a high-k gate dielectric layer). For example, after forming the gate dielectrics, a protective layer is formed to protect the high-k gate dielectric layer from damage or etching during a subsequent fluorine treatment. The fluorine treatment begins by depositing a fluorine-containing layer over the protective layer or by converting an upper portion of the protective layer to the fluorine-containing layer. After forming the fluorine-containing layer, an anneal process is performed to diffuse fluorine from the fluorine-containing layer through the protective layer and into the gate dielectrics. The fluorine may fill some or all vacancies in the gate dielectrics (e.g., in the high-k gate dielectric layer). In addition, fluorine may attach to dangling bonds (e.g., dangling silicon bonds) near the interface between the interfacial layer and an underlying semiconductor substrate. As a result, an effective oxide thickness of the high-k gate dielectric layer and the interfacial layer may be tuned (e.g., voltage tuning), while also improving reliability and mobility thereof. The semiconductor device may be manufactured with an improved yield and function with greater robustness.

FIG. 1 illustrates an example of nano-FETs (e.g., nanowire FETs, nanosheet FETs, nanostructure FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectrics 100 are over top surfaces of the fins 66 and along top surfaces, sidewalls, and bottom surfaces of the nanostructures 55. Gate electrodes 102 are over the gate dielectrics 100. Epitaxial source/drain regions 92 are disposed on the fins 66 on opposing sides of the gate dielectric 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 30C are cross-sectional views of intermediate stages in the manufacturing of nano-FETs, in accordance with some embodiments. FIGS. 2 through 5, 6A, 13A, 14A, 15A, 16A, 17A, 18A, 19A, 20A, 21A, 22A, 23A, 24A, 25A, 26A, 27A, 28A, 29A, and 30A illustrate reference cross-section A-A' illustrated in FIG. 1. FIGS. 6B, 7B, 8B, 9B, 10B, 11B, 11C, 12B, 12D, 13B, 14B, 15B, 16B, 17B, 18B, 19B, 20B, 21B, 22B, 23B, 24B, 25B, 26B, 27B, 28B, 29B, and 30B illustrate reference cross-section B-B' illustrated in FIG. 1. FIGS. 7A, 8A, 9A, 10A, 11A, 12A, 12C, 13C, 25C, 27C, 28C, 29C, and 30C illustrate reference cross-section C-C' illustrated in FIG. 1.

Figure 2:
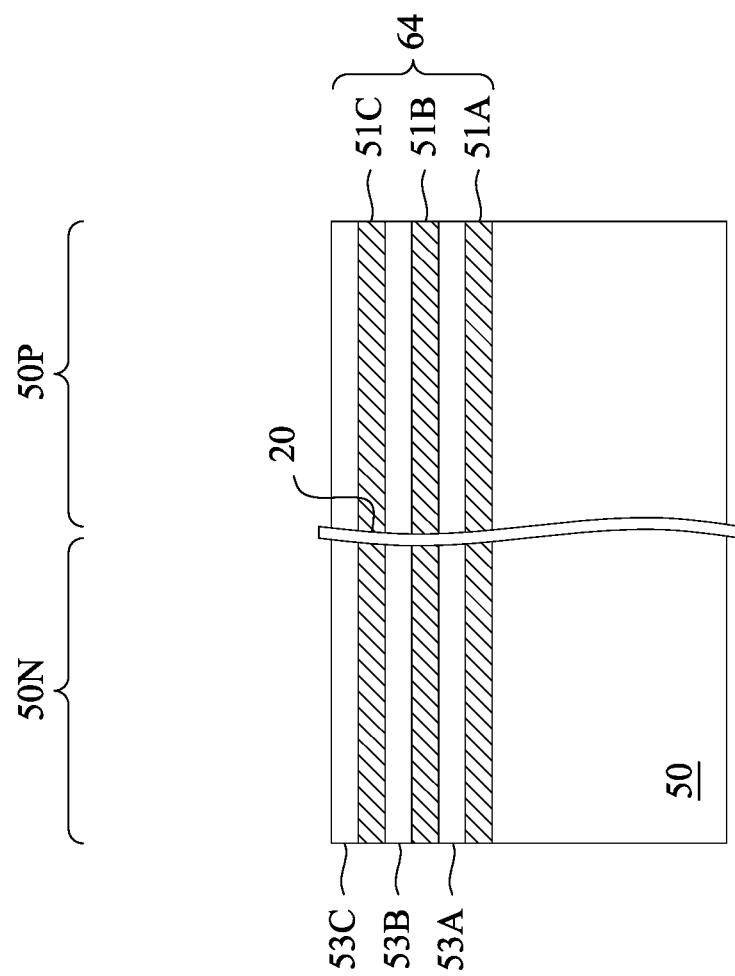

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors (e.g., n-type nano-FETs), and the p-type region 50P can be for forming p-type devices, such as PMOS transistors (e.g., p-type nano-FETs). The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided. In some embodiments, one or more wells and/or an anti-punch through (APT) layer may be formed in the substrate 50 through one or more suitable implantation steps.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type regions 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type regions 50P.

Figure 30C:
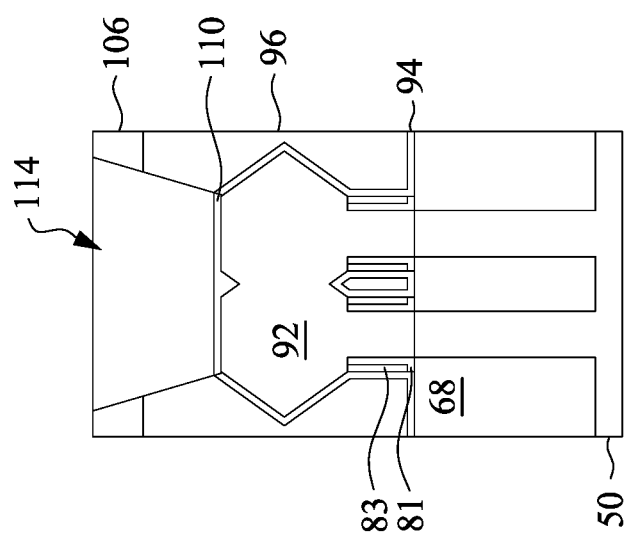

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of non-FETs in both the n-type region 50N and the p-type region 50P. In such embodiments, the channel regions in both the n-type region 50N and the p-type region 50P may have a same material composition (e.g., silicon, or the like) and be formed simultaneously. FIGS. 30A-30C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

Figure 28B:
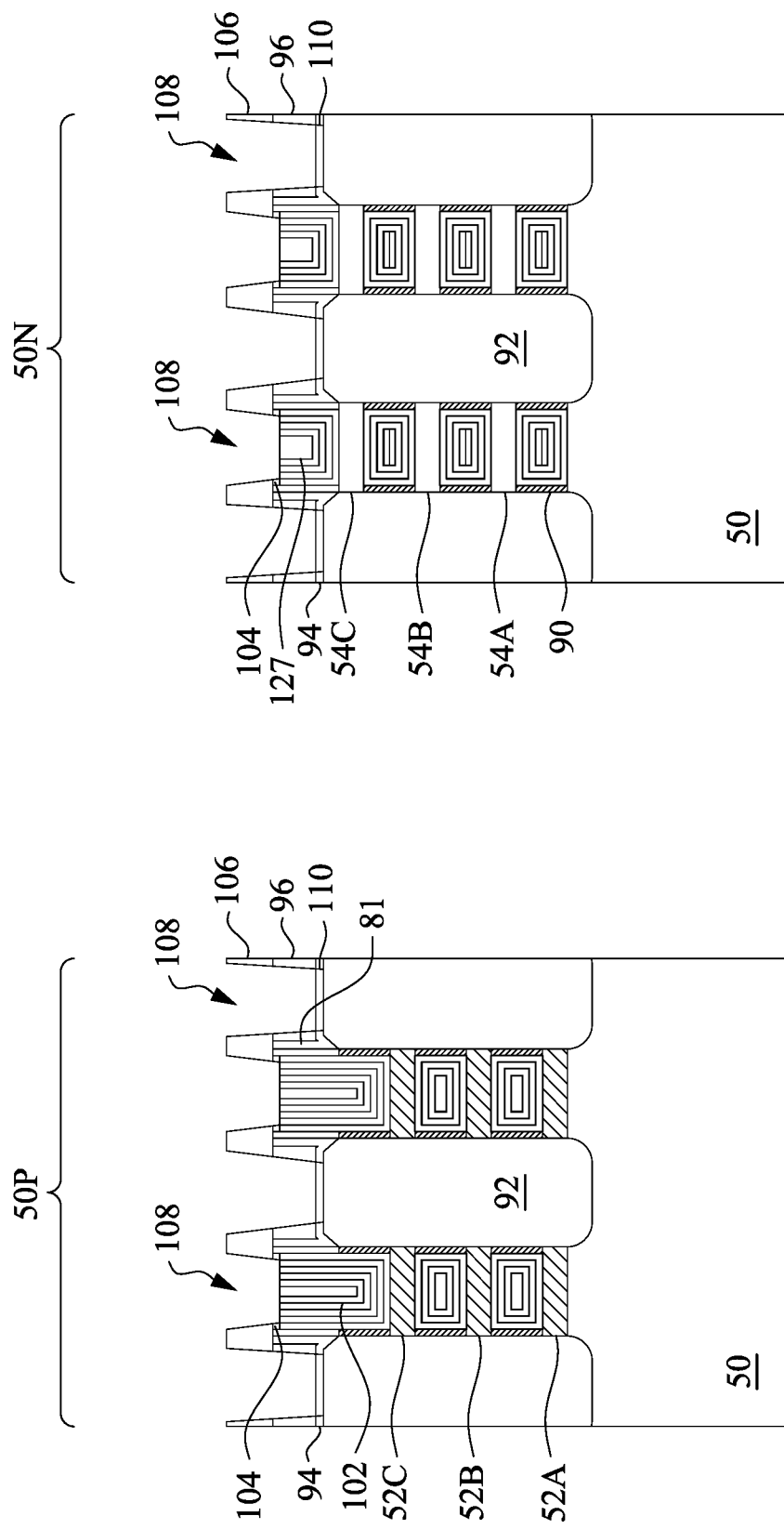
Figure 28C:
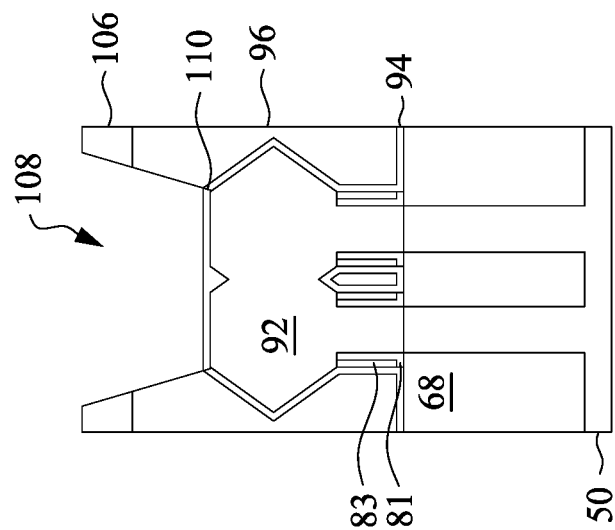

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs. In other embodiments, the channel regions in the n-type region 50N and the p-type region 50P may be formed simultaneously and have a same material composition, such as silicon, silicon germanium, or the like. FIGS. 28A, 28B, and 28C illustrate a structure resulting from such embodiments where the channel regions in both the p-type region 50P and the n-type region 50N comprise silicon, for example.

Figure 3:
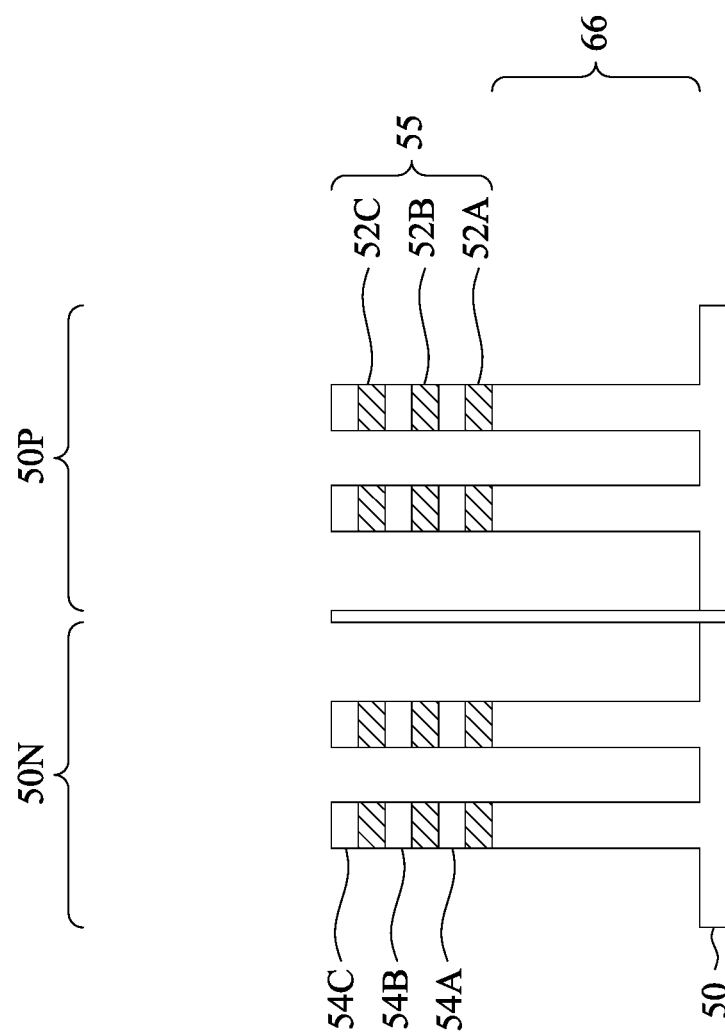

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
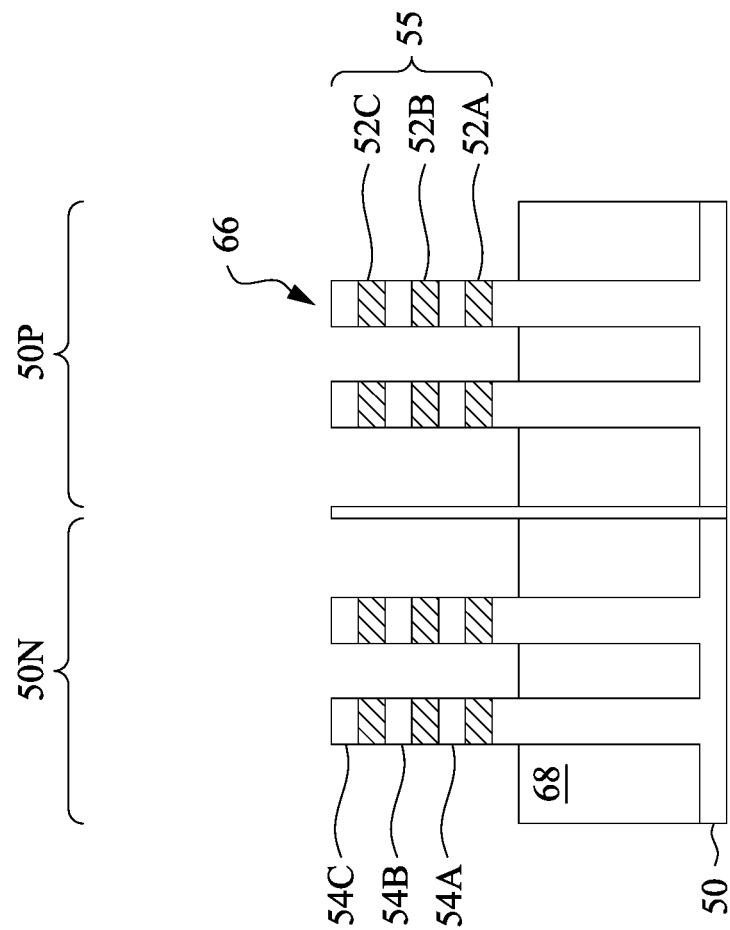

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
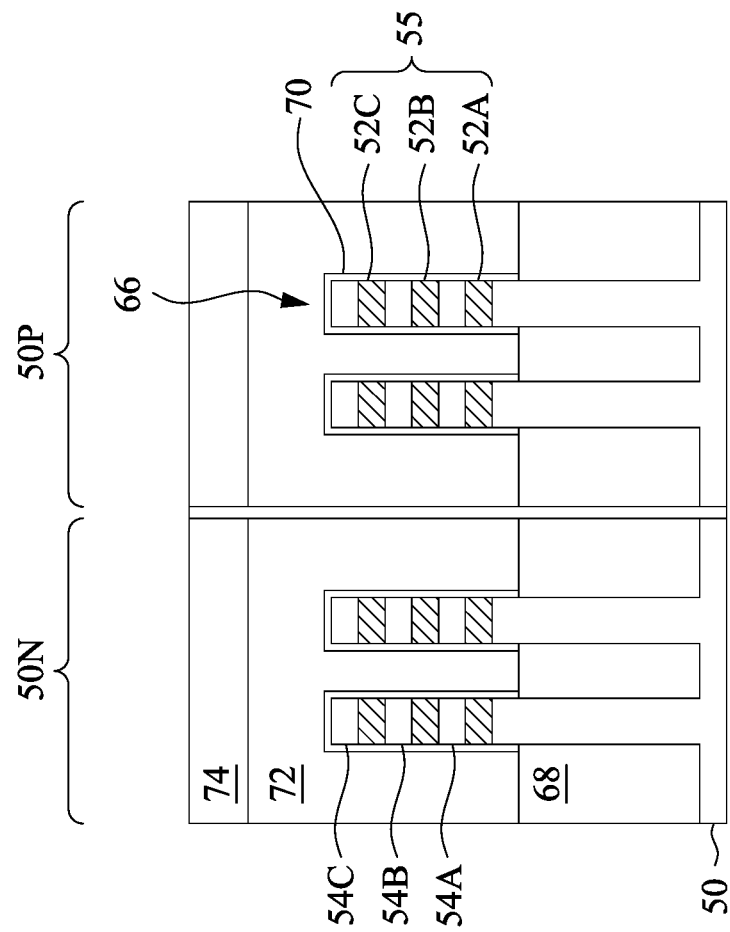

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
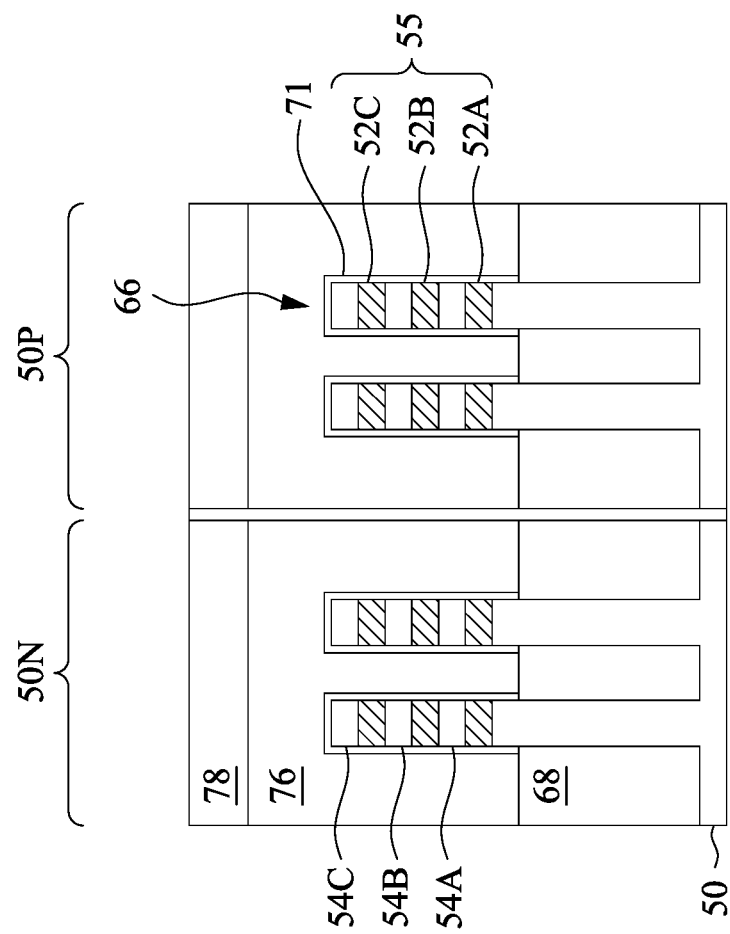

FIGS. 6A through 15B illustrate various additional steps in the manufacturing of embodiment devices. FIGS. 6A, 7A, 8A, 9A, 10A, 11A, 12A, 12C, 13A, 13C, 14A, and 15A illustrate features in either the n-type region 50N or the p-type region 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 6B:
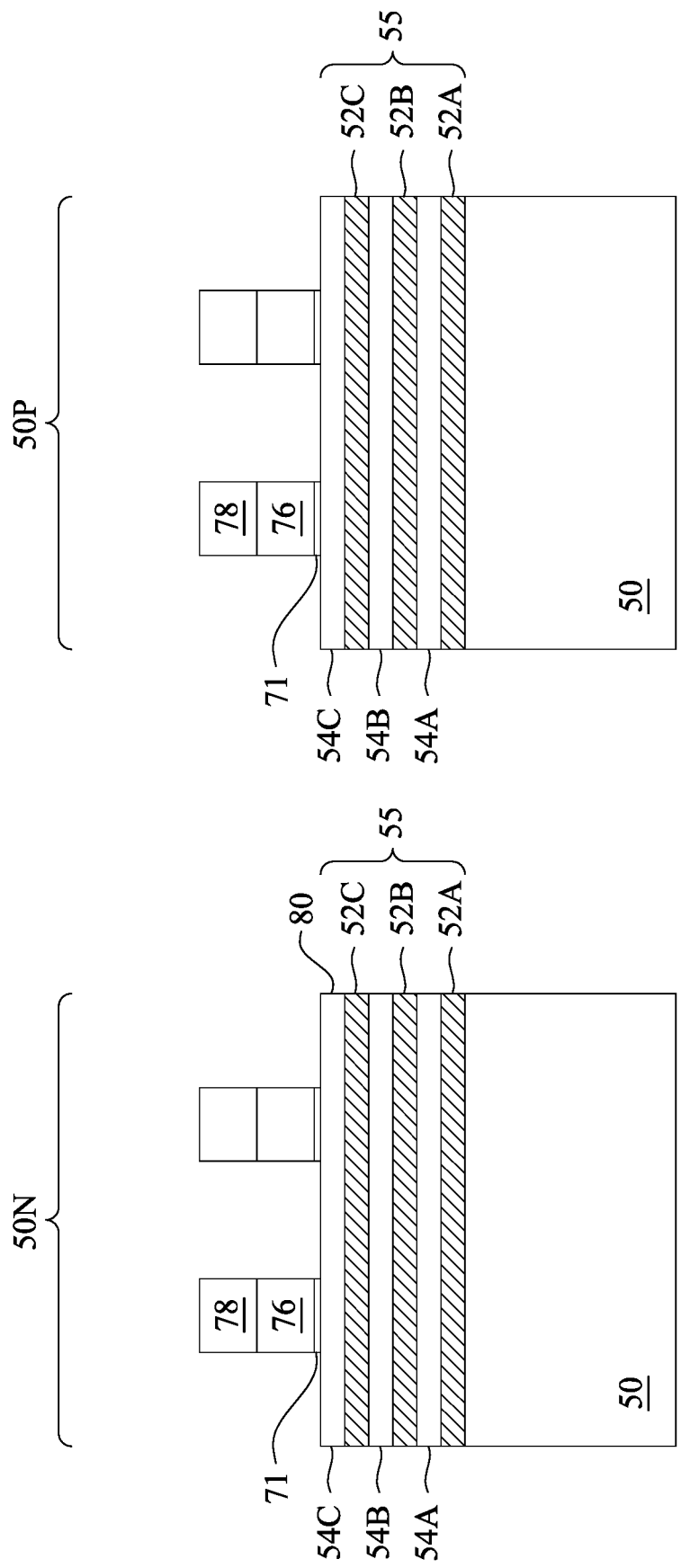
Figure 7A:
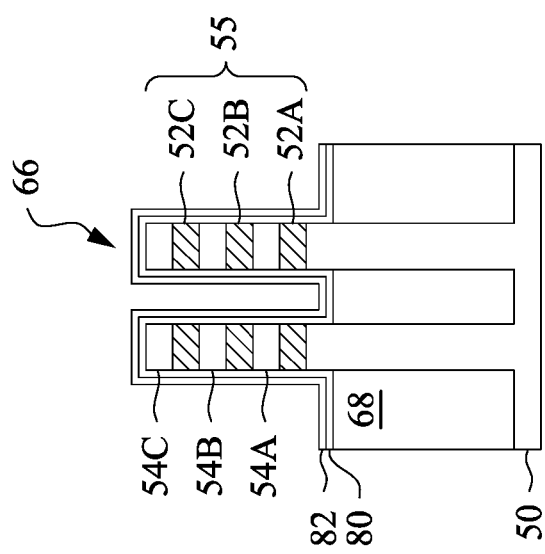
Figure 7B:
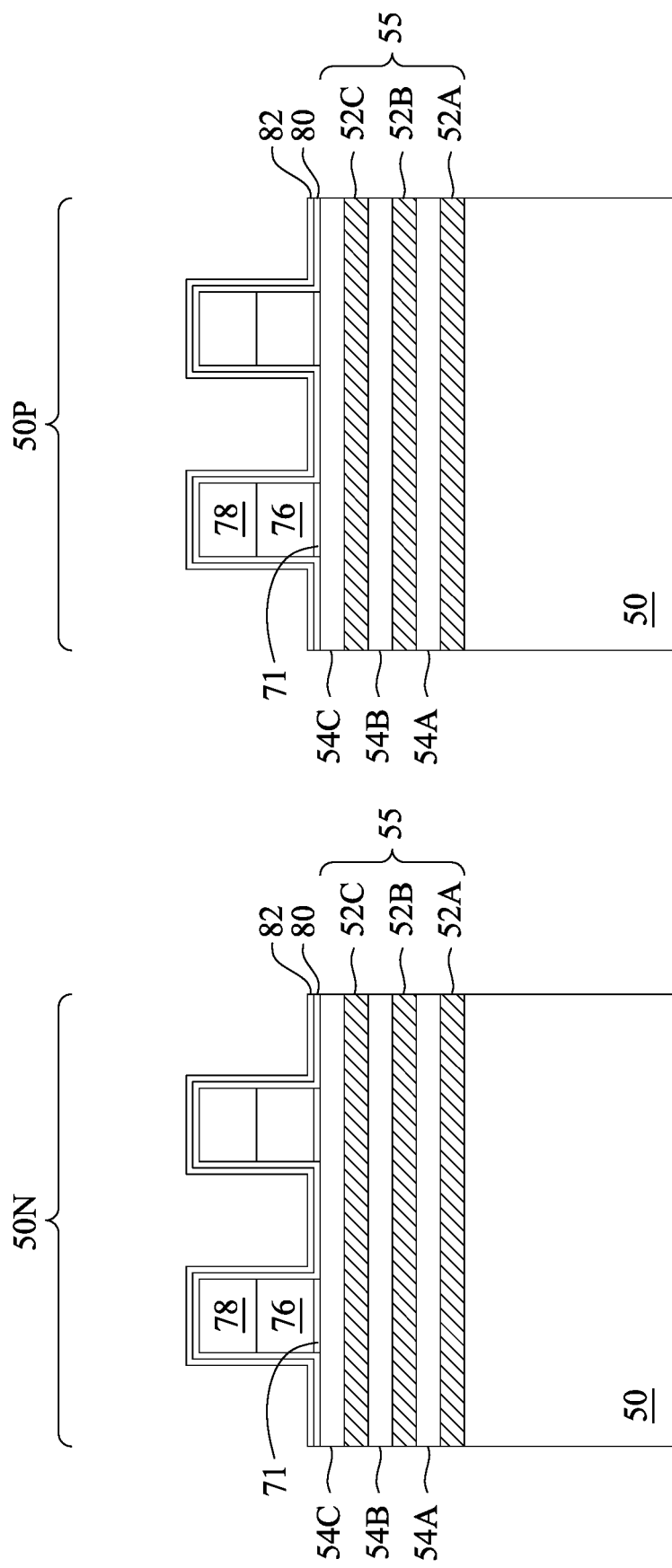

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8A:
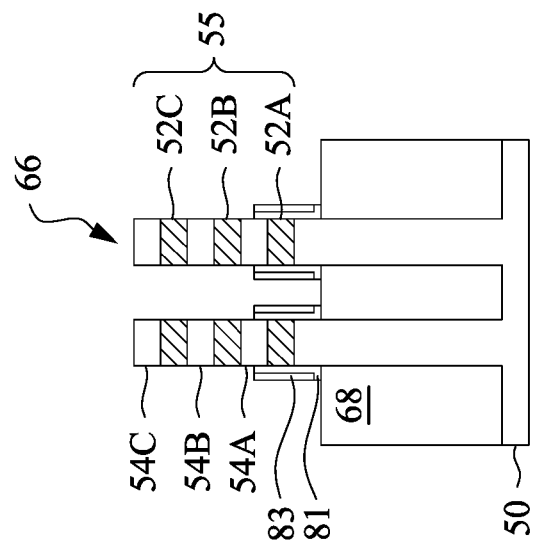
Figure 8B:
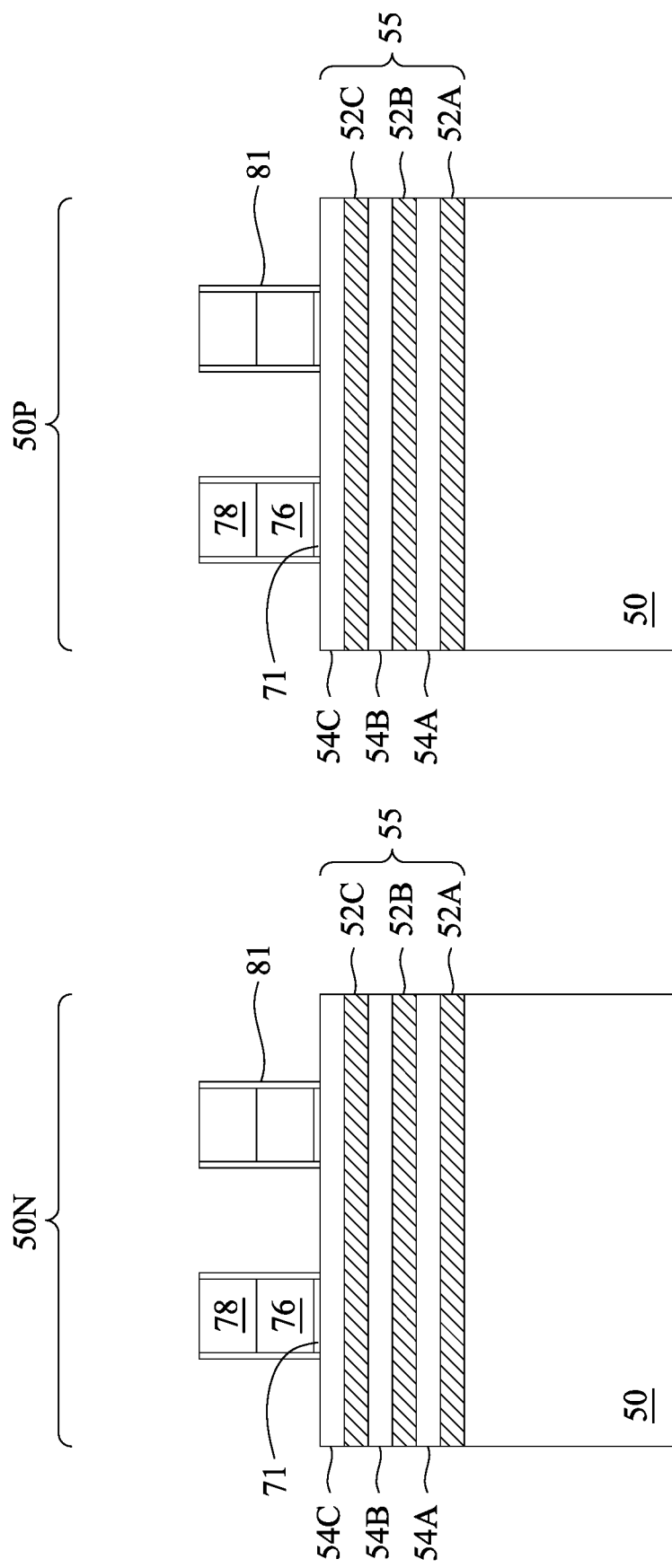

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-align subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), a combination of each, or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, a different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
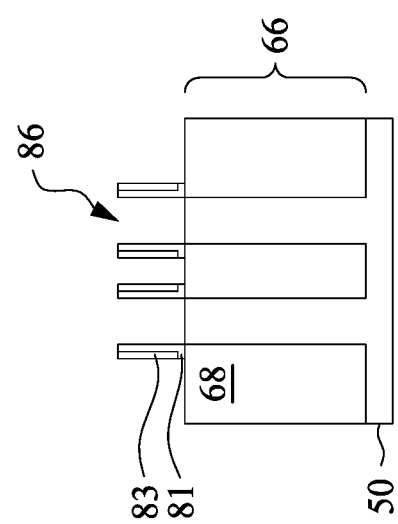
Figure 9B:
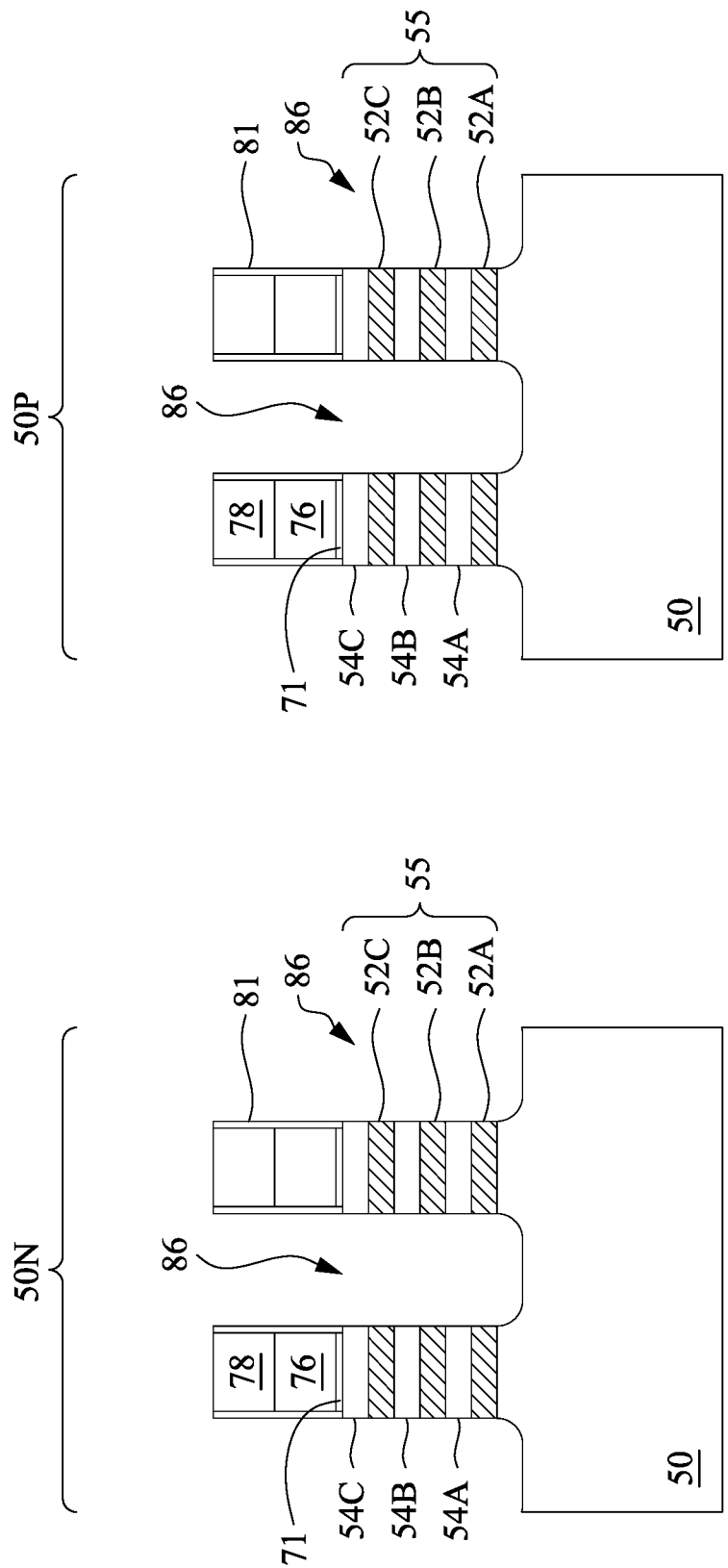

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
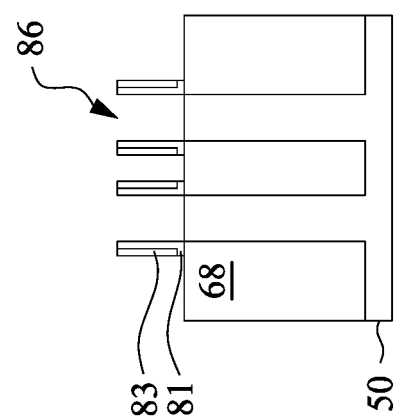
Figure 10B:
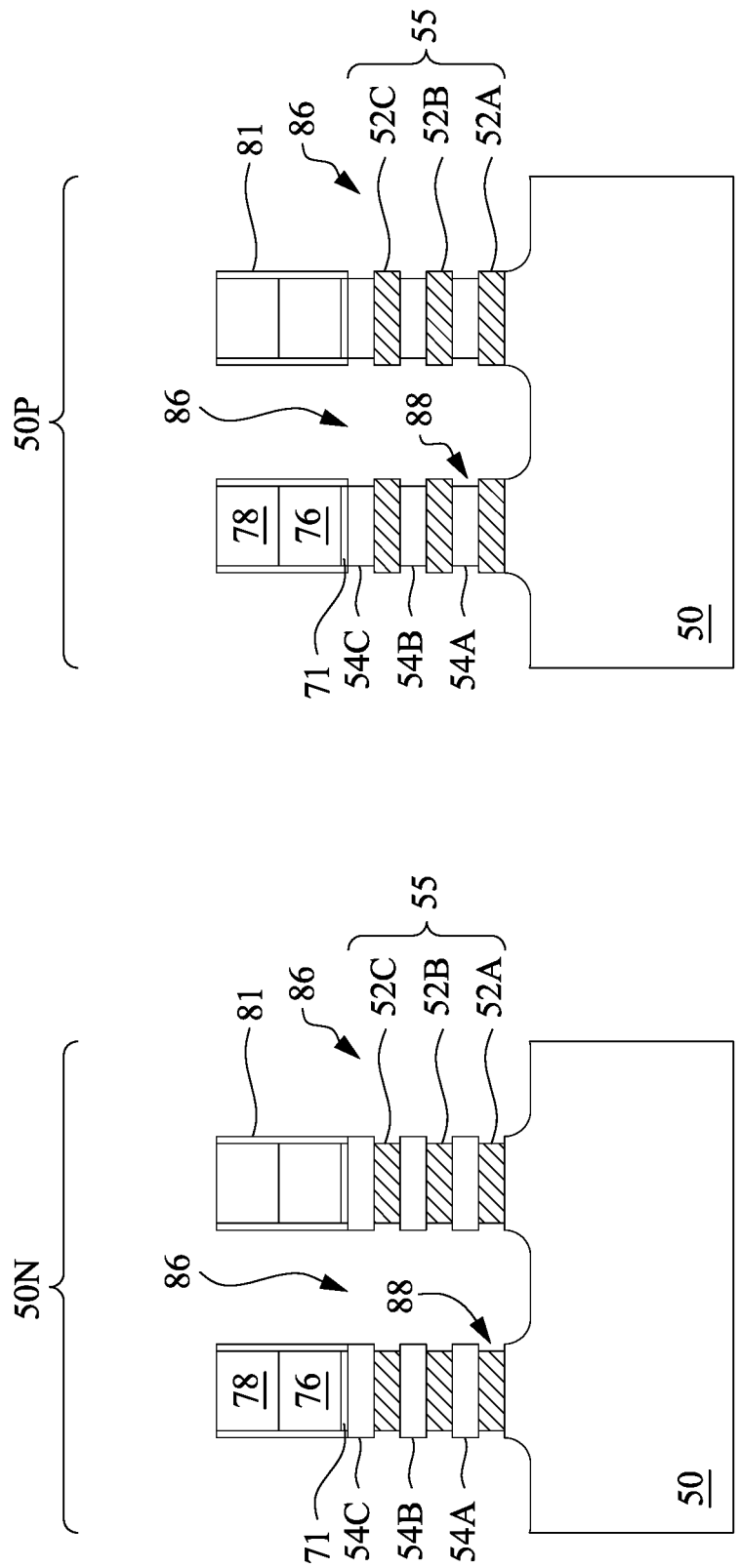

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 64 formed of the second semiconductor materials (e.g., the second nanostructures 54) exposed by the first recesses 86 are etched to form sidewall recesses 88 in the p-type region 50P. Although sidewalls of the first nanostructures 52 and the second nanostructures 54 in recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52 in the n-type region 50N, and a dry etch process with hydrogen fluoride, another fluorine-based gas, or the like may be used to etch sidewalls of the second nanostructures 54 in the p-type region 50P.

Figure 11A:
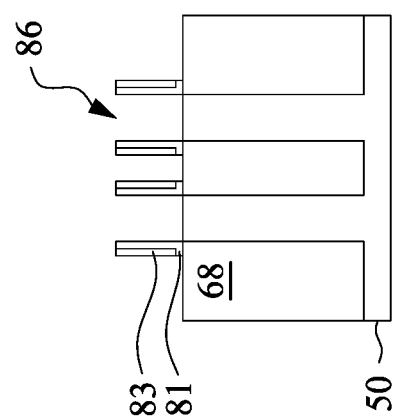
Figure 11B:
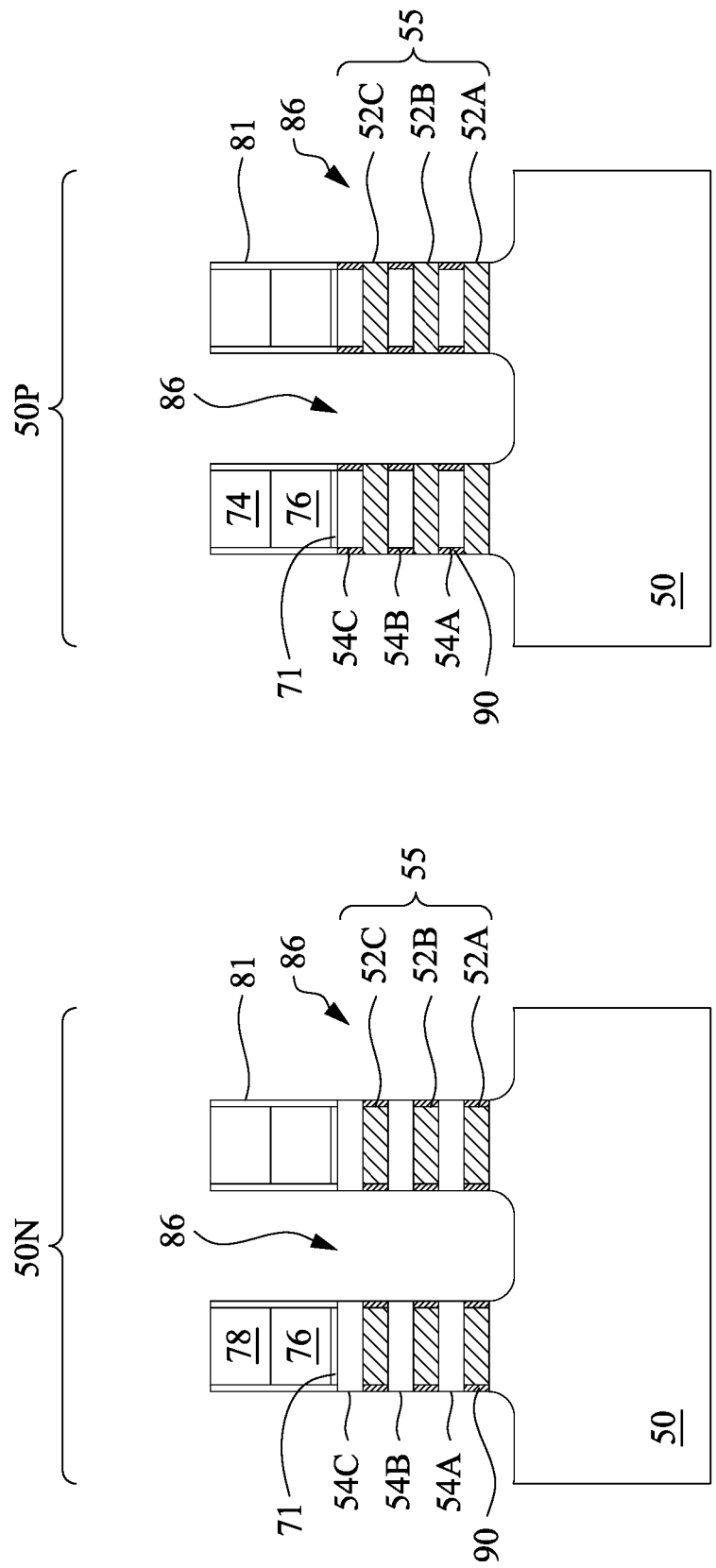
Figure 11C:
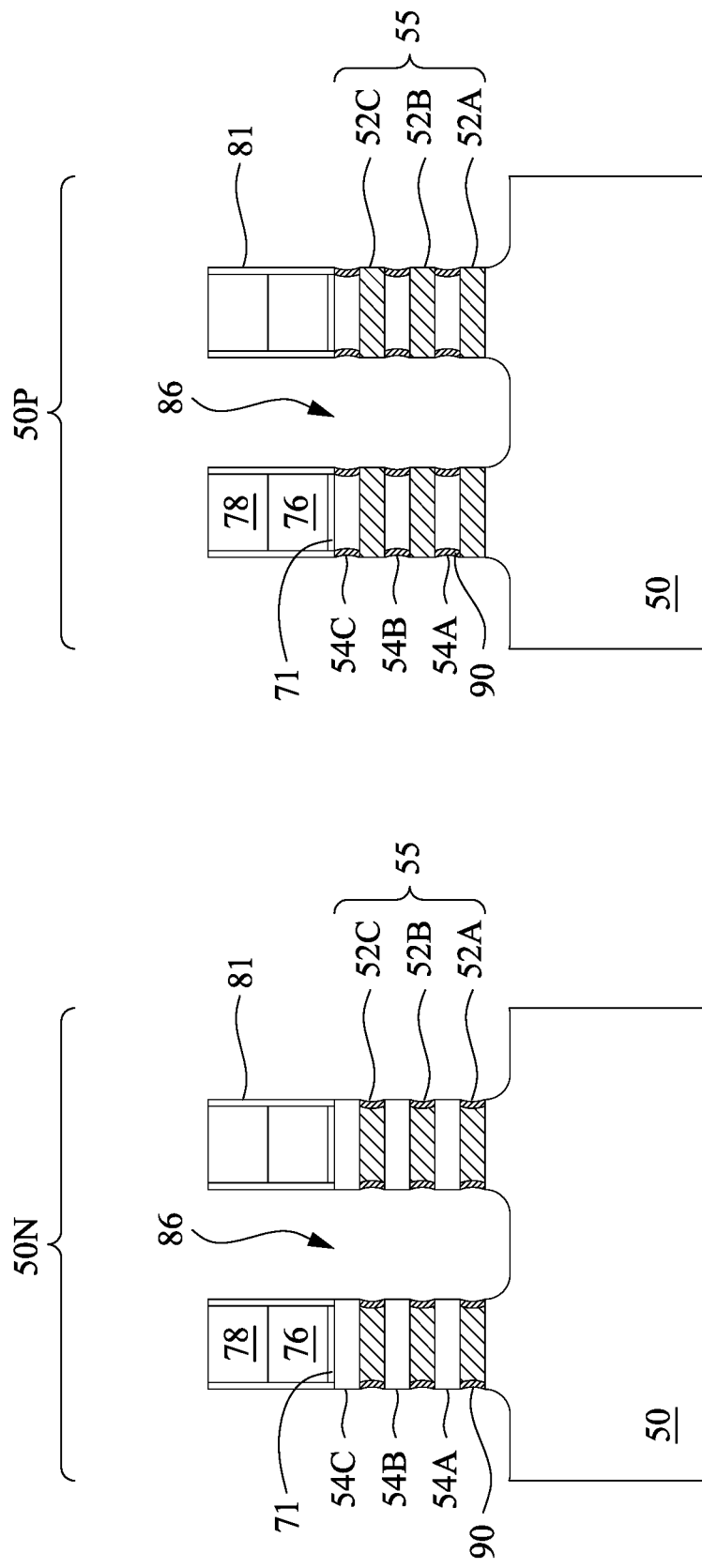

In FIGS. 11A-11C, first inner spacers 90 are formed in the sidewall recess 88. The first inner spacers 90 may be formed by depositing an inner spacer layer (not separately illustrated) over the structures illustrated in FIGS. 10A and 10B. The first inner spacers 90 act as isolation features between subsequently formed source/drain regions and a gate structure. As will be discussed in greater detail below, source/drain regions will be formed in the recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 11B, the outer sidewalls of the first inner spacers 90 may be concave or convex. As an example, FIG. 11C illustrates an embodiment in which sidewalls of the first nanostructures 52 are concave, outer sidewalls of the first inner spacers 90 are concave, and the first inner spacers are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A-12C) by subsequent etching processes, such as etching processes used to form gate structures.

Figure 12A:
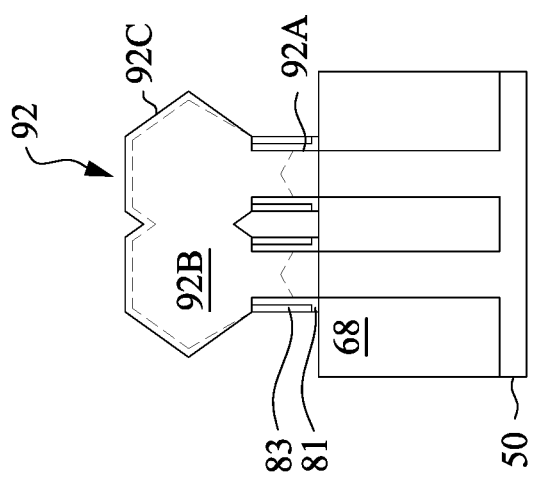
Figure 12B:
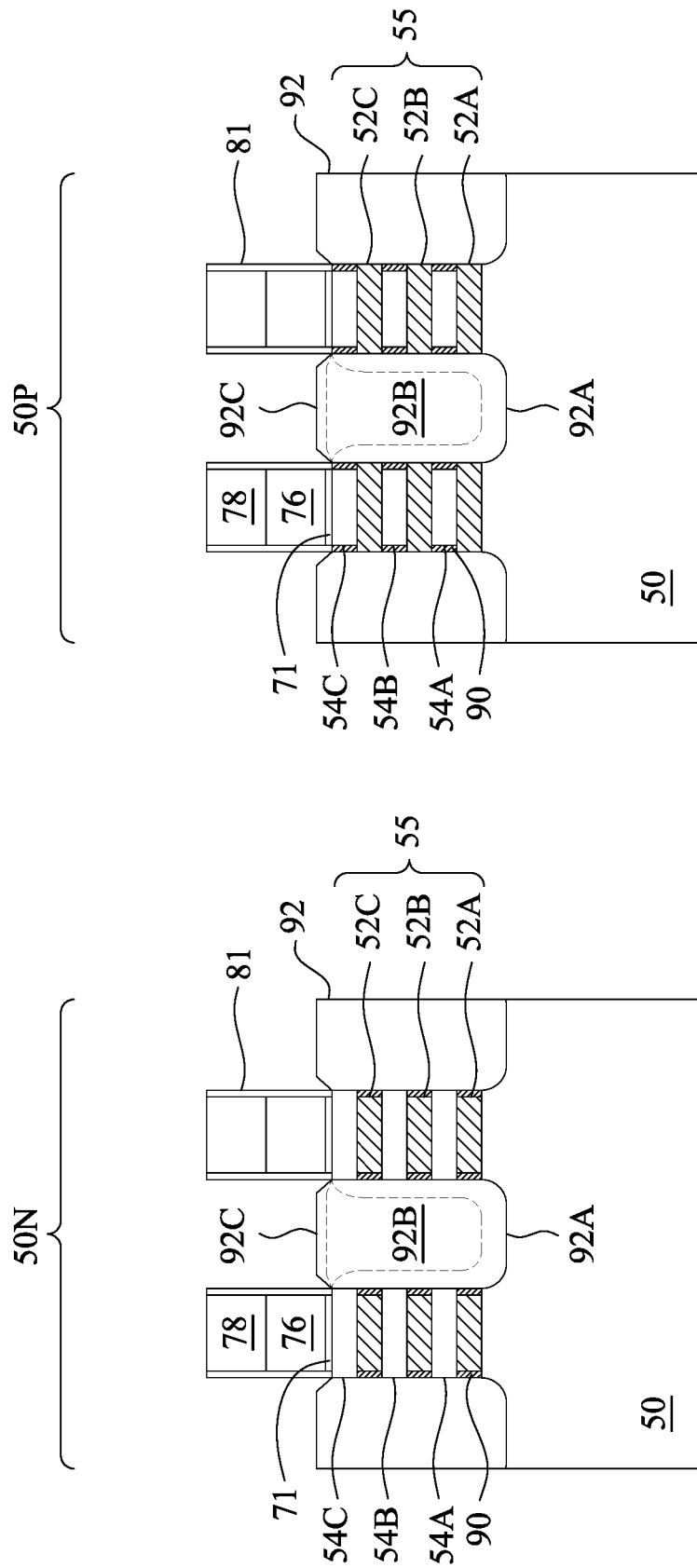
Figure 12C:
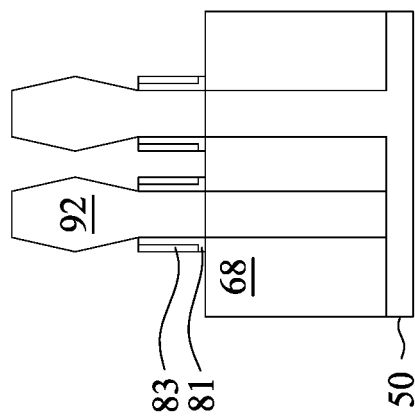

In FIGS. 12A-12C, epitaxial source/drain regions 92 are formed in the first recesses 86. In some embodiments, the source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 72 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N (e.g., the NMOS region) may be formed by masking the p-type region 50P (e.g., the PMOS region). Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P (e.g., the PMOS region) may be formed by masking the n-type region 50N (e.g., the NMOS region). Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same NSFET to merge as illustrated by FIG. 12A. In other embodiments, adjacent epitaxial source/drain regions 92 remain separated after the epitaxy process is completed as illustrated by FIG. 12C. In the embodiments illustrated in FIGS. 12A and 12C, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12D:
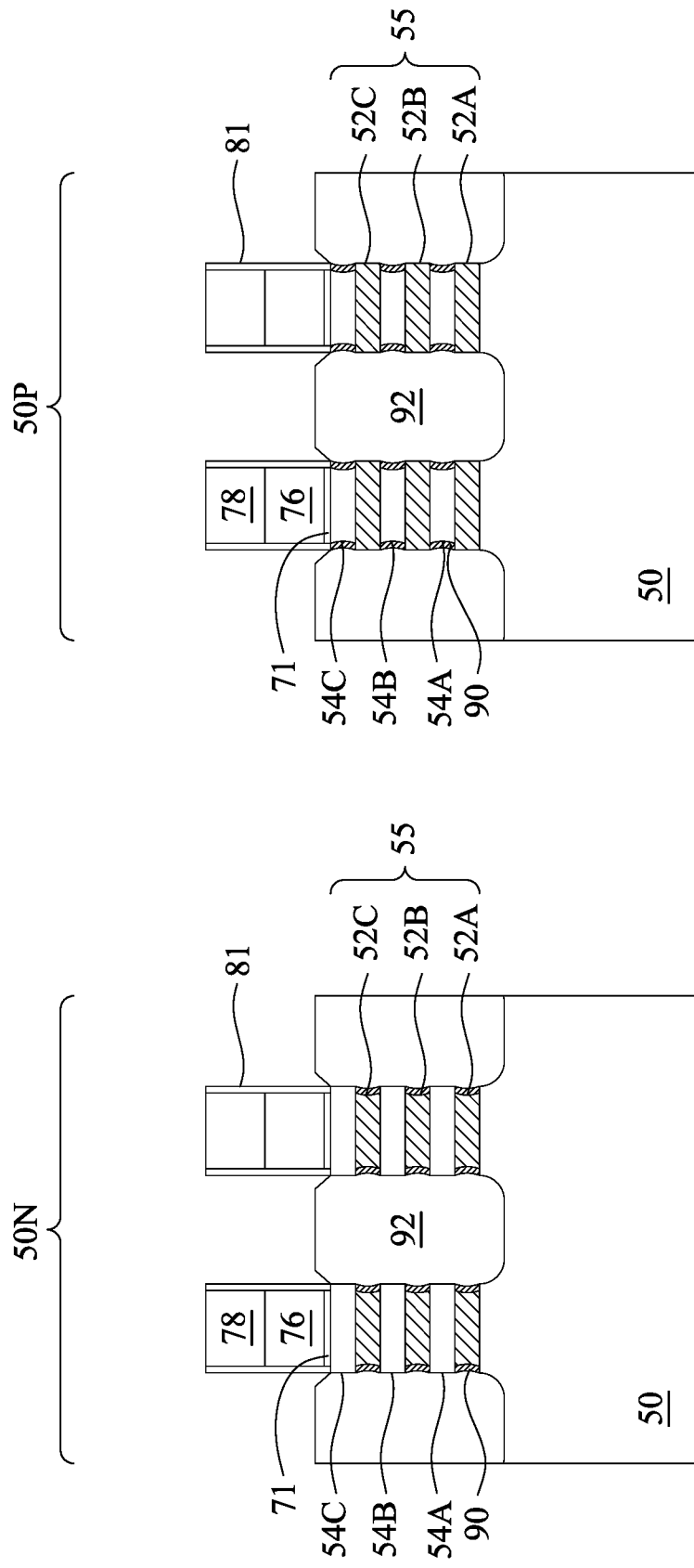

FIG. 12D illustrates embodiments in which sidewalls of the first nanostructures 52 in the n-type region 50N and sidewalls of the second nanostructures 54 in the p-type region 50P are concave, outer sidewalls of the first inner spacers 90 are concave, and the first inner spacers 90 are recessed from sidewalls of the second nanostructures 54 and the first nanostructures 52, respectively. As illustrated in FIG. 12D, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P. Further, in embodiments where the first inner spacers 90 are recessed from sidewalls of the second nanostructures 54 and/or the first nanostructures 52, the epitaxial source/drain regions 92 may be formed between the second nanostructures 54 and/or the first nanostructures 52, respectively.

Figure 13A:
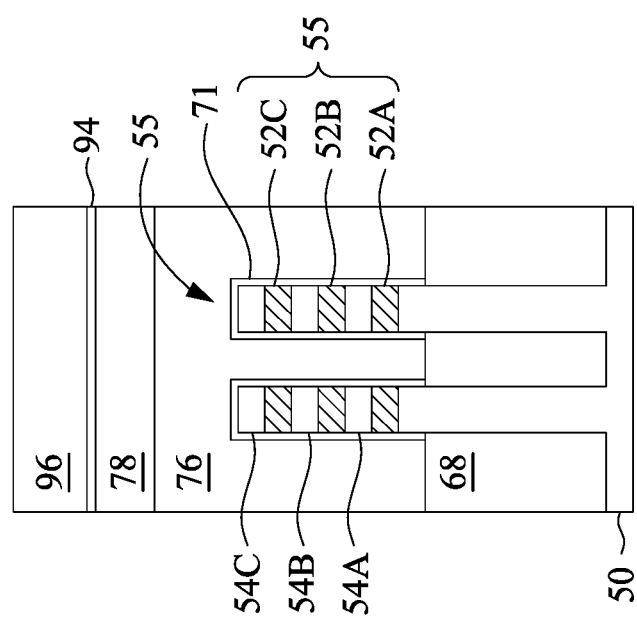
Figure 13B:
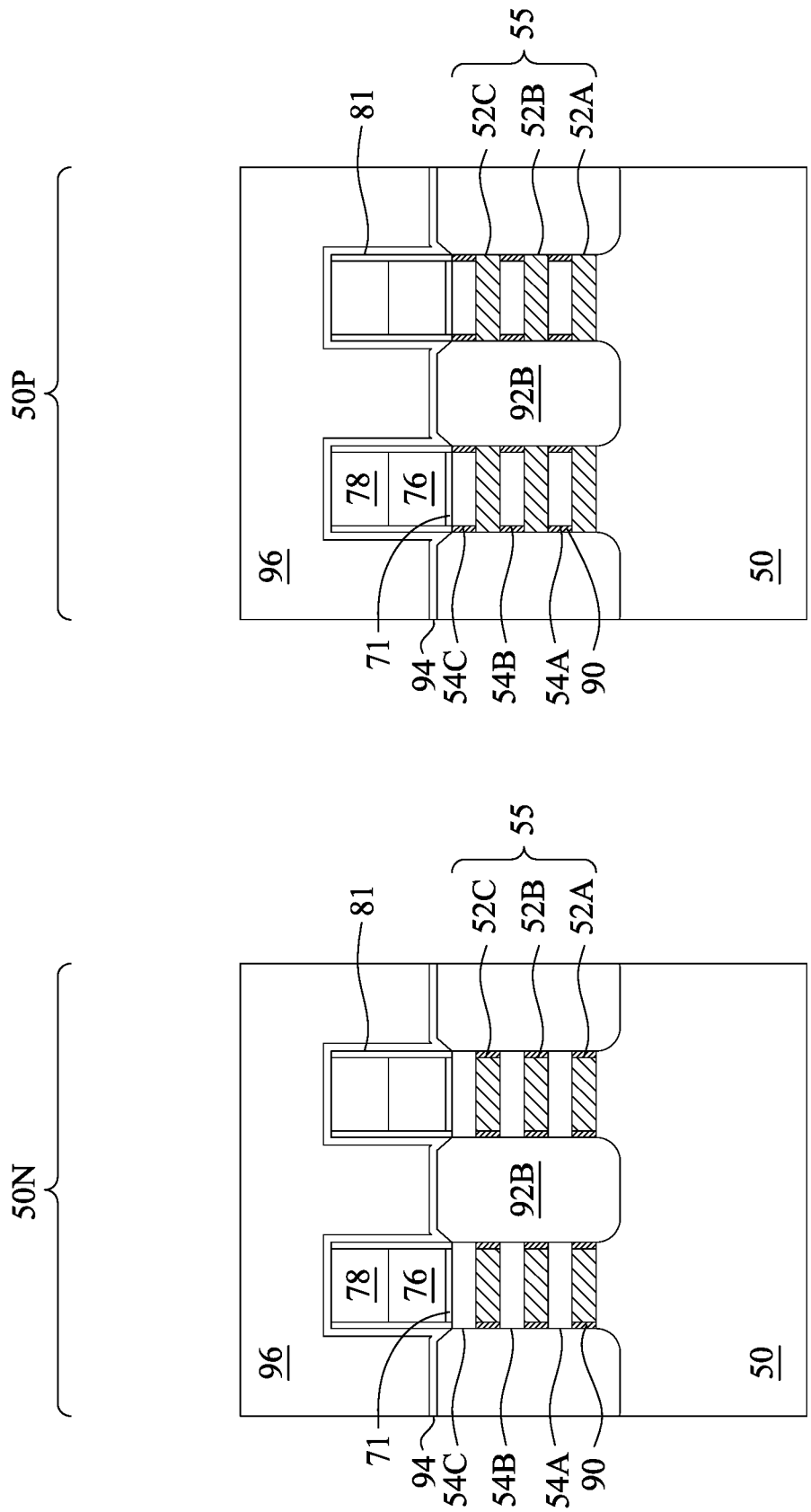
Figure 13C:
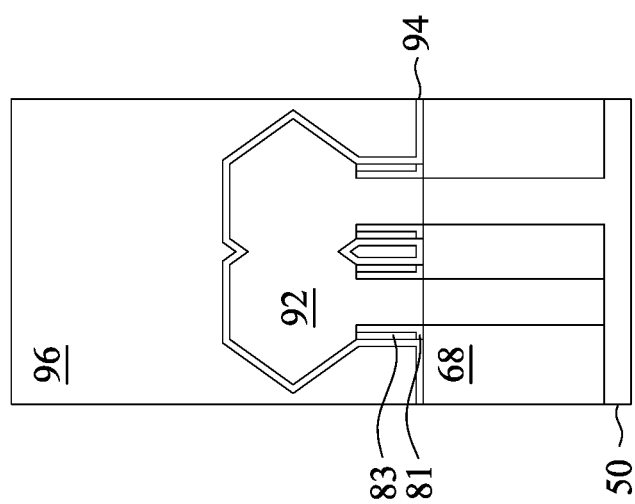

In FIGS. 13A-13C, a first interlayer dielectric (ILD) 96 is deposited over the structure illustrated in FIGS. 6A, 12B, and 12A (the processes of FIGS. 7A-12D do not alter the cross-section illustrated in FIG. 6A). The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14A:
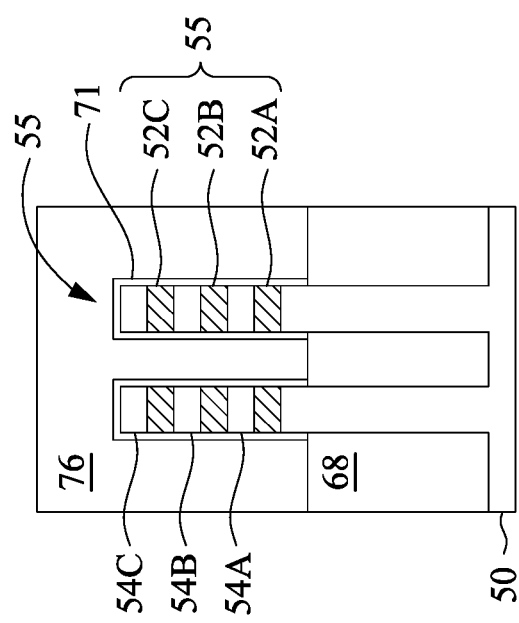
Figure 14B:
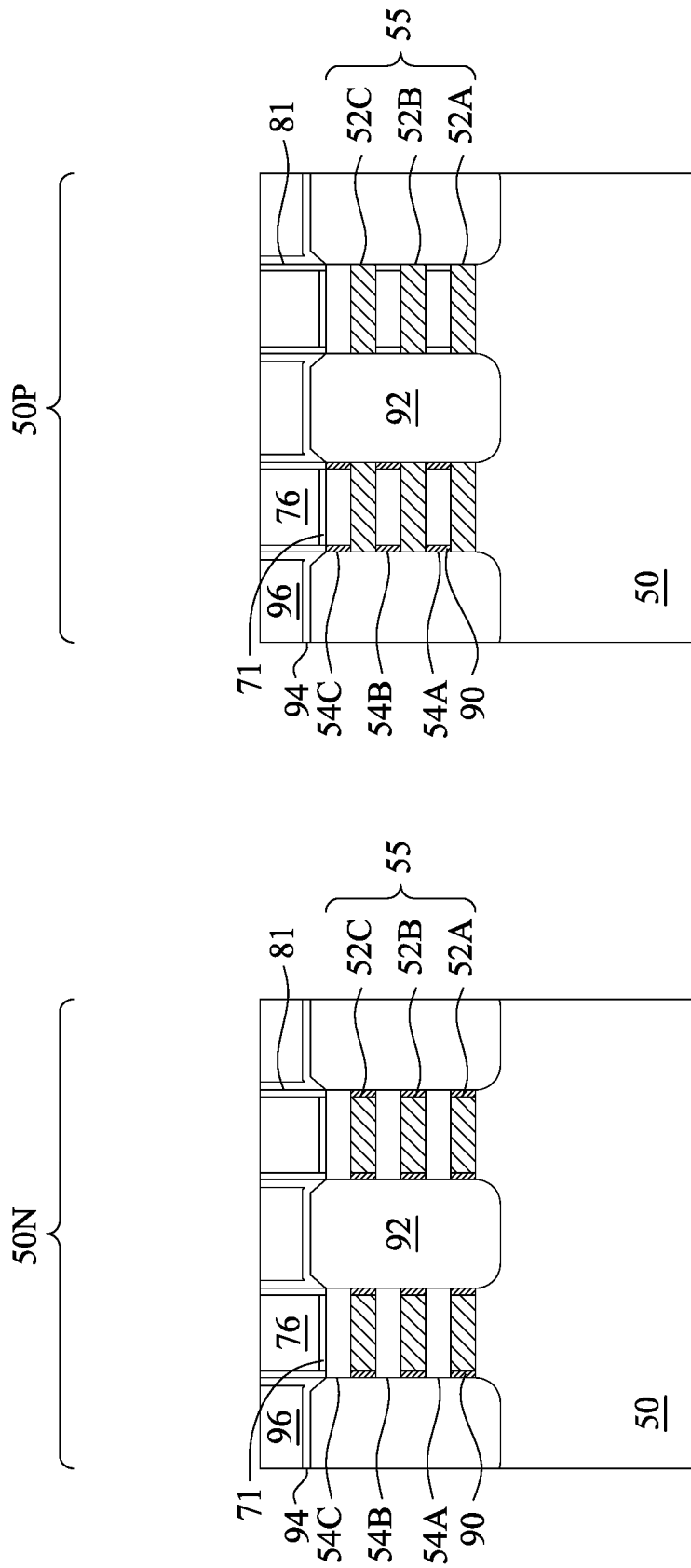

In FIGS. 14A-14B, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 72 are exposed through the first ILD 96. In some embodiments, the masks 78 may remain, in which case the planarization process levels the top surface of the first ILD 96 with top surface of the masks 78 and the first spacers 81.

Figure 15A:
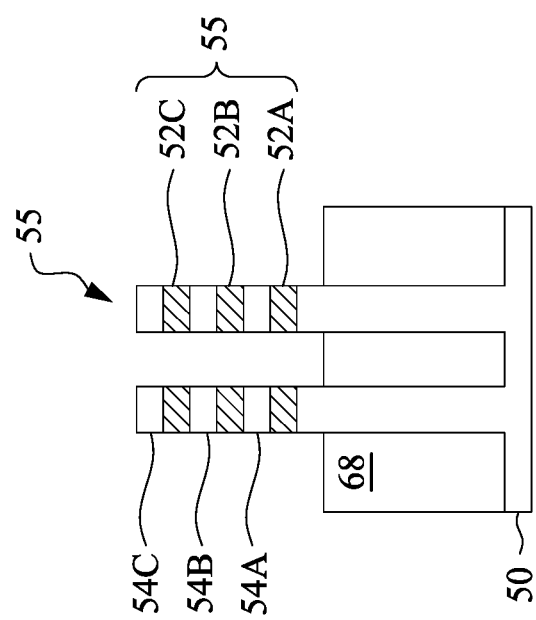
Figure 15B:
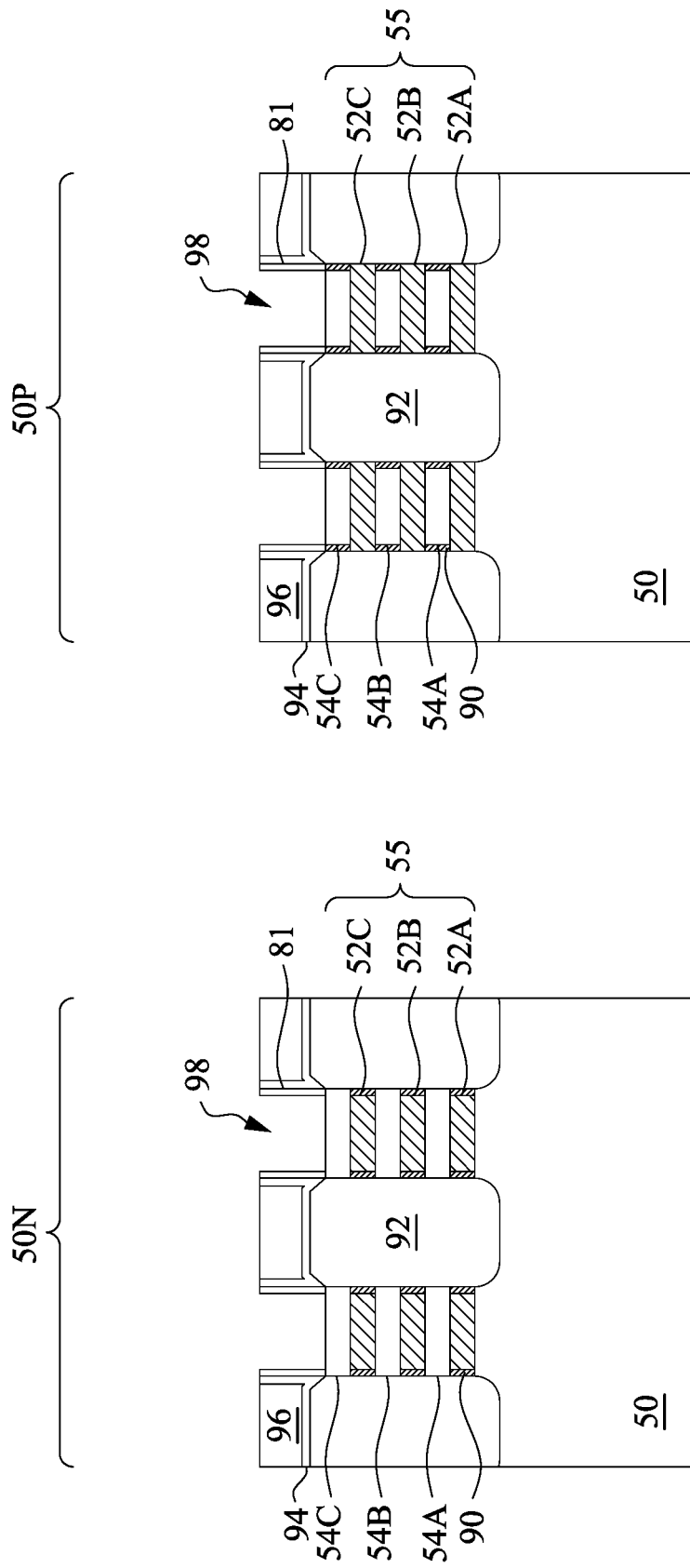

In FIGS. 15A and 15B, the dummy gates 72, and the masks 78 if present, are removed in one or more etching steps, so that second recesses 98 are formed. Portions of the dummy dielectric layers 60 in the second recesses 98 may also be removed. In some embodiments, the dummy gates 72 and the dummy dielectric layers 60 are removed by an anisotropic dry etch process. For example, the etching process may include a dry etch process using reaction gas(es) that selectively etch the dummy gates 72 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gates 72 are etched. The dummy dielectric layers 60 may then be removed after the removal of the dummy gates 72.

Figure 16B:
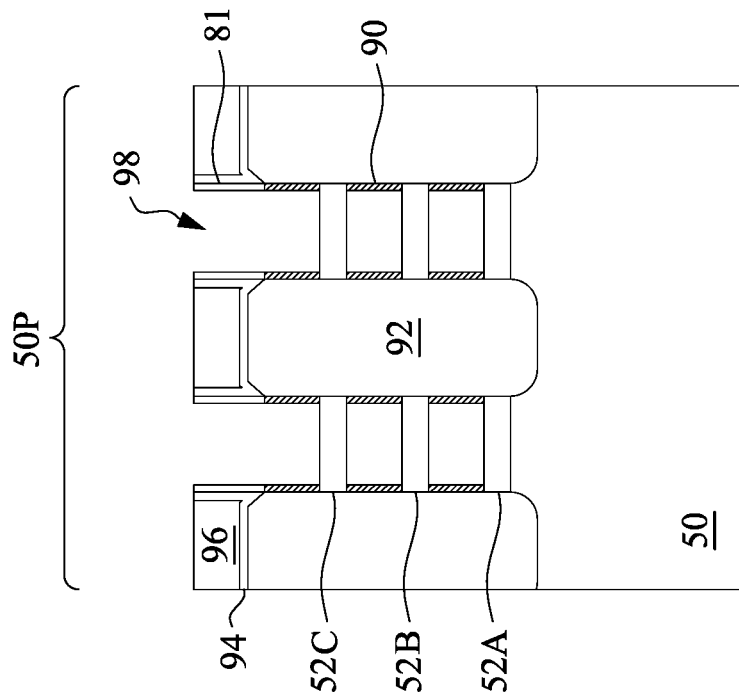
Figure 16A:
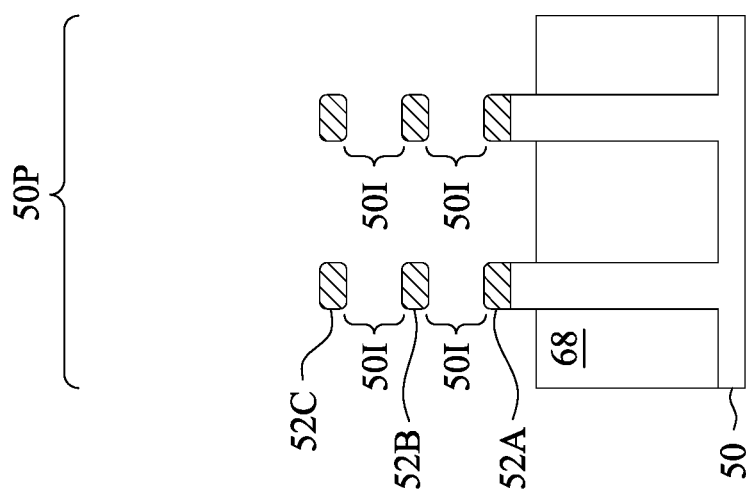

In FIGS. 16A and 16B, to form openings 130, the second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based gas, or the like may be used to remove the second nanostructures 54 in the p-type region 50P. After the removal process, the openings 130 comprise regions 50I between each of the first nanostructures 52.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nano-FETs and p-type nano-FETs may have a same material composition, such as silicon, silicon germanium, or the like. FIGS. 28A, 28B, and 28C illustrate a structure resulting from such embodiments where the channel regions in both the p-type region 50P and the n-type region 50N are provided by the second nanostructures 54 and comprise silicon, for example.

In FIGS. 17A through 26B, gate dielectrics 100 and gate electrodes 102/127 are formed for replacement gate structures in the second recesses 98 according to some embodiments. The gate dielectrics 100 (e.g., a high-k gate dielectric) and the gate electrodes 102 (e.g., a work function metal or WFM layer) are treated with aluminum and fluorine, respectively. As a result of aluminum and fluorine soaks discussed in greater detail below, a flatband voltage ($V_FB$) of the resulting transistor can be increased towards a band edge of the metal of the WFM layer, a threshold voltage of the resulting transistor can be decreased, and device performance may be improved.

The formation of the gate dielectrics in the n-type region 50N and the p-type region 50P may occur simultaneously such that the gate dielectrics in each region are formed from the same materials, and the formation of the gate electrodes may occur simultaneously such that the gate electrodes in each region are formed from the same materials. In some embodiments, the gate dielectrics in each region may be formed by distinct processes, such that the gate dielectrics may be different materials and/or have a different number of layers, and/or the gate electrodes in each region may be formed by distinct processes, such that the gate electrodes may be different materials and/or have a different number of layers. Various masking steps may be used to mask and expose appropriate regions when using distinct processes. In the following description, the gate electrodes of the n-type region 50N and the gate electrodes of the p-type region 50P are formed separately.

FIGS. 17A through 25D illustrate forming the gate dielectrics 100, performing a fluorine treatment, and forming the gate electrodes 102 in the p-type region 50P. In some embodiments, the n-type region 50N may be masked at least while forming the gate electrodes 102 in the p-type region 50P. Although the p-type region 50P is illustrated, the gate dielectrics 100 may be formed simultaneously or separately in the n-type region 50N. In addition, the fluorine treatment may also be performed simultaneously or separately in the n-type region 50N.

Figure 17B:
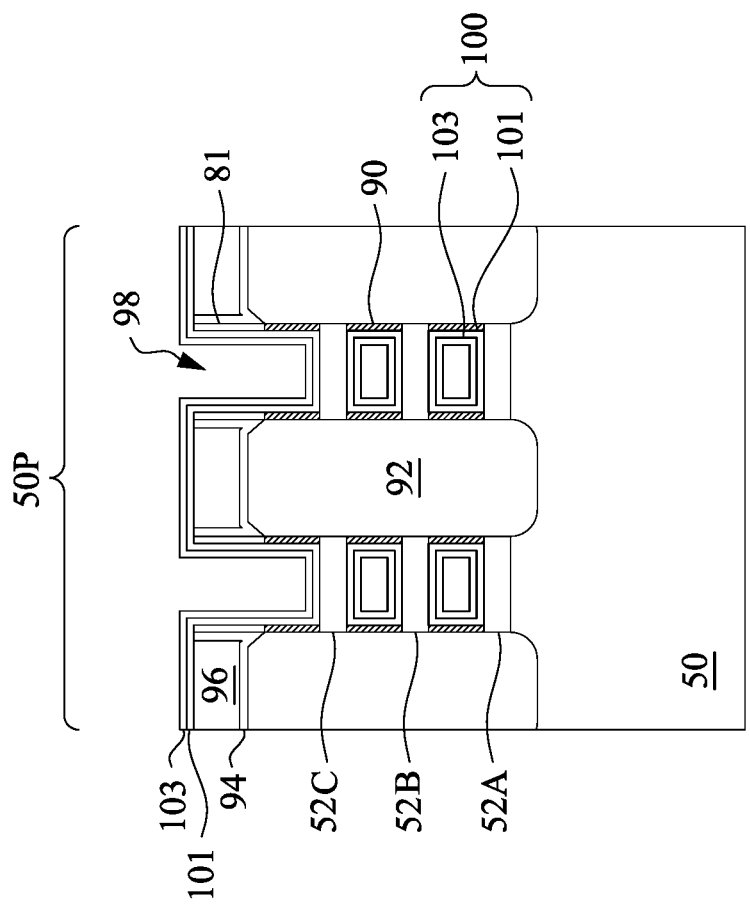
Figure 17A:
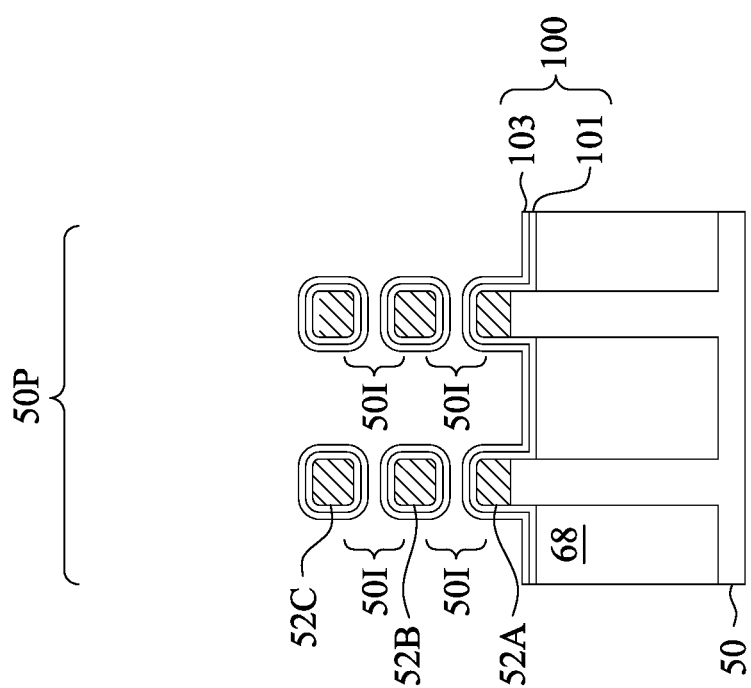

In FIGS. 17A and 17B, gate dielectrics 100 are deposited conformally in the second recesses 98 in the p-type region 50P. The gate dielectrics 100 comprise one or more dielectric layers, such as an oxide, a metal oxide, the like, or combinations thereof. For example, in some embodiments, the gate dielectrics 100 may comprise a first gate dielectric 101 (e.g., comprising silicon oxide, or the like) and a second gate dielectric 103 (e.g., comprising a metal oxide, or the like) over the first gate dielectric 101. In some embodiments, the second gate dielectric 103 includes a high-k dielectric material, and in these embodiments, the second gate dielectric 103 may have a k-value greater than about 7.0, and may include a metal oxide or a silicate of hafnium, aluminum, zirconium, lanthanum, manganese, barium, titanium, lead, or combinations thereof. The first gate dielectric 101 may be referred to as an interfacial layer, and the second gate dielectric 103 may be referred to as a high-k gate dielectric in some embodiments. In some embodiments, formation of the gate dielectrics 100 may include formation of vacancies or voids in the material. For example, the vacancies may be portions of the first gate dielectric 101 and the second gate dielectric 103 in which the dielectric materials may not have fully condensed during or after deposition. Further, formation of the first gate dielectric 101 over the substrate 50 (e.g., the fins 66) may result in dangling bonds (e.g., dangling silicon bonds) at the interface between the first gate dielectric 101 and the substrate 50 also, for example, due to incomplete reactions during formation.

The structure of the gate dielectrics 100 may be the same or different in the n-type region 50N and the p-type region 50P. For example, the n-type region 50N may be masked or exposed while forming the gate dielectrics 100 in the p-type region 50P. In embodiments where the n-type region 50N is exposed, the gate dielectrics 100 may be simultaneously formed in the n-type regions 50N. The formation methods of the gate dielectrics 100 may include molecular-beam deposition (MBD), ALD, PECVD, and the like.

Figure 18B:
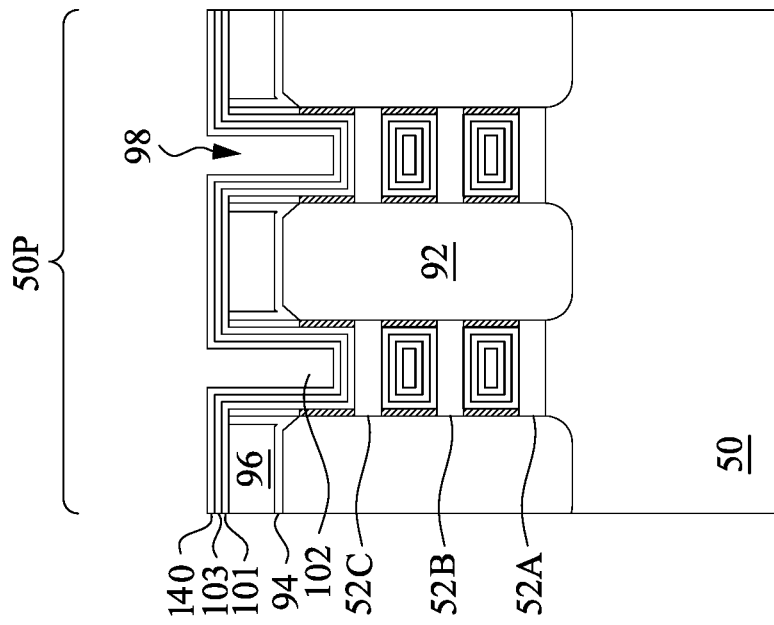
Figure 18A:
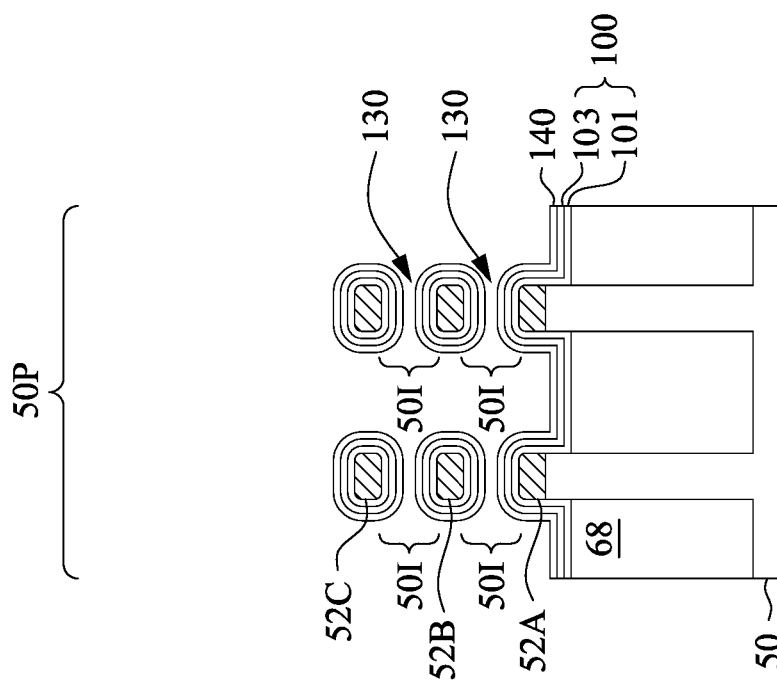

In FIGS. 18A and 18B, a protective material 140 is deposited conformally over the gate dielectrics 100. In some embodiments, the protective material 140 is a conductive material comprising titanium nitride, tantalum nitride, titanium silicon nitride (TiSiN or TSN), or the like. The protective material 140 may be deposited by CVD, ALD, PECVD, or the like. For example, the protective material 140 may be formed at temperatures of between about 300° C. and about 600° C. and at pressures between about 0.2 Torr and about 50 Torr. As discussed below, the protective material 140 will protect the underlying gate dielectrics 100 during subsequent processing steps, such as during the fluorine treatment.

The protective material 140 may be deposited to surround each of the first nanostructures 52 and formed to a thickness of between about 5 Å and about 20 Å. The protective material 140 being greater than 5 Å ensures that a complete monolayer (e.g., titanium nitride) is deposited. The protective material 140 being less than 20 Å ensures that a desired or sufficient amount of fluorine is able to pass through the protective material 140 and into the gate dielectrics 100 during the fluorine treatment. In addition, the protective material 140 being less than 20 Å ensures that the gate dielectrics 100 maintain low concentration levels of metal elements that may diffuse from the protective material 140.

Figure 19B:
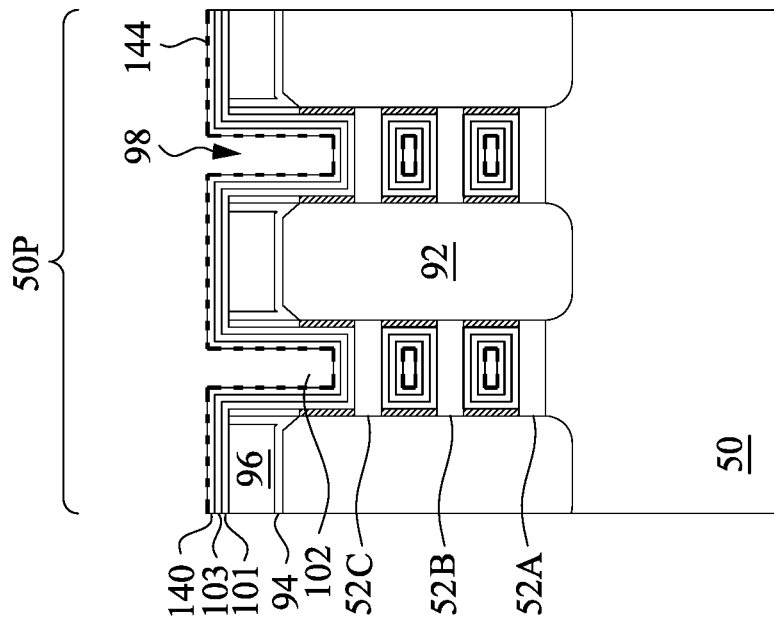
Figure 19A:
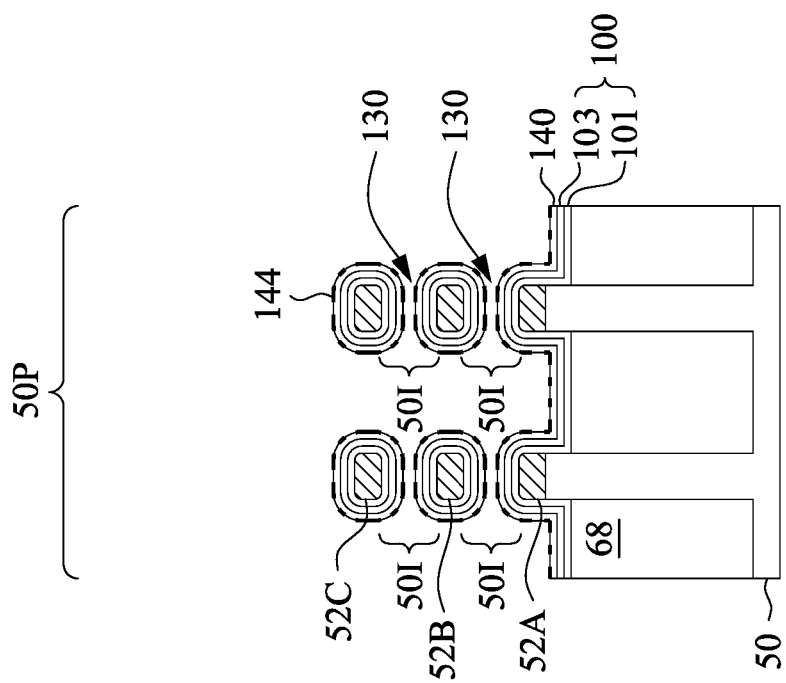

In FIGS. 19A and 19B, a fluorine-containing layer 144 is formed over the protective material 140, either by a deposition process or by a soak process. In embodiments that use a deposition process, such as CVD, ALD, or the like, the fluorine-containing layer 144 is deposited over a surface of the protective material 140. For example, a fluorine-containing precursor and a reducing agent precursor are flowed over the surface of the protective material 140. The fluorine-containing precursor may be $WF_6$, and the reducing agent precursor may be $SiH_4$, $B_2H_6$, $H_2$, the like, or combinations thereof. Presence of the protective material 140 prevents the precursors (e.g., the fluorine-containing precursor) from etching the second gate dielectric 103. The fluorine-containing layer 144 may be deposited at temperatures of between about 250° C. and about 475° C. and at pressures of between about 0.5 Torr and about 400 Torr. Fluorine is part of a gas phase byproduct removed during deposition of the fluorine-containing layer 144 in a reaction that does not occur to completion. As a result, the fluorine-containing layer 144 deposited over the protective material 140 may comprise mostly tungsten with trace amounts of fluorine remaining in the layer. For example, a concentration of fluorine in the deposited fluorine-containing layer 144 may be less than about 30%.

In embodiments that use a soak process, a fluorine-containing precursor is flowed over the surface of the protective material 140 to convert an upper portion of the protective material 140 to the fluorine-containing layer 144. The fluorine-containing precursor may be $WF_6$, $NF_3$, $CF_4$, $CaF_2$, $CrF_6$, $MoF_6$, the like, or combinations thereof. Molecules of the fluorine-containing precursor may remain intact while diffusing into the upper portion of the protective material 140 or the molecules of the fluorine-containing precursor may at least partially dissociate. In some embodiments not specifically illustrated, the soak process may further form a discontinuous fluorine-containing residue on the surface of the protective material 140. The soak process may be performed at temperatures of between about 250° C. and about 475° C., at pressures of between about 0.5 Torr and about 50 Torr, and for a duration of between about 0.1 seconds and about 1 hour.

Figure 20B:
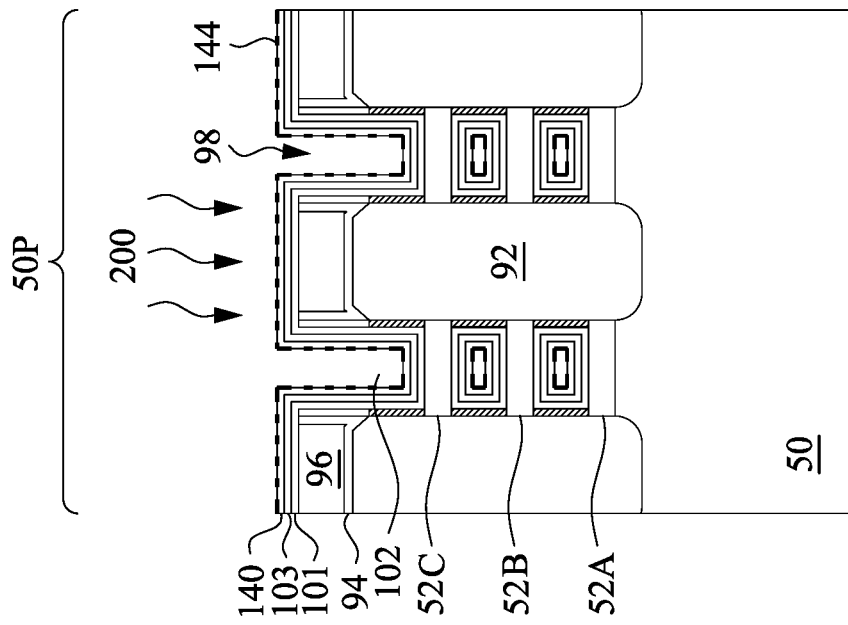
Figure 20A:
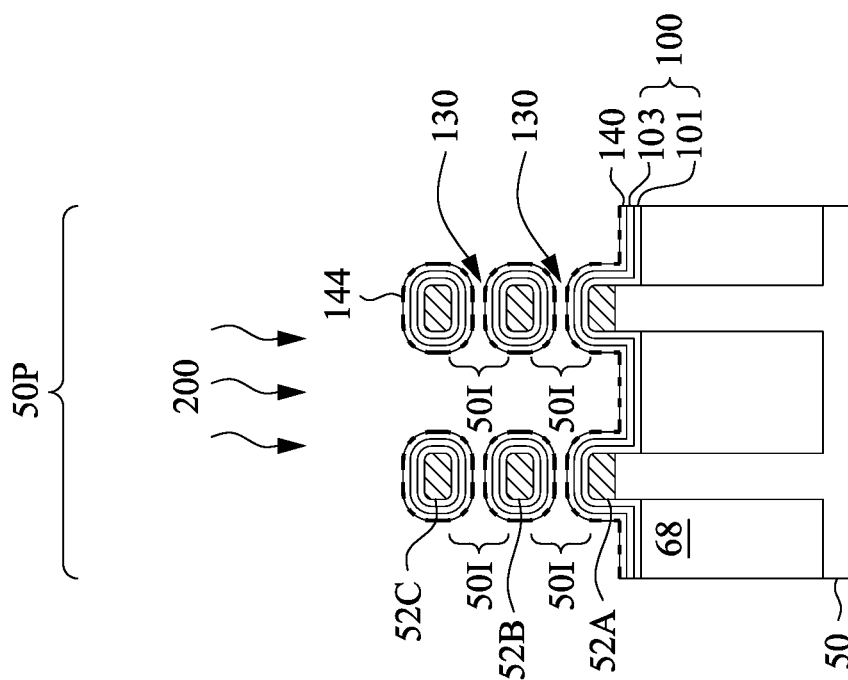

In FIGS. 20A and 20B, an anneal process 200 is performed to diffuse fluorine from the fluorine-containing layer 144 through the protective material 140 and into the gate dielectrics 100. The metals present in the protective material 140 (e.g., titanium) and the fluorine-containing layer 144 (e.g., tungsten) may further assist in attracting and driving the fluorine into the gate dielectrics 100. Some of the fluorine fills vacancies or microvoids in the gate dielectrics 100, and some of the fluorine may attach to dangling silicon bonds at the interface between the first gate dielectric 101 and the substrate 50. The anneal process 200 may be performed at temperatures of between about 150° C. and about 750° C. and for a duration of between about 0.5 seconds and about 60 seconds.

Following the anneal process 200, the second gate dielectric 103 (e.g., comprising hafnium oxide) may have an atomic ratio of fluorine-to-metal (e.g., fluorine-to-hafnium) of between about 0.005 and about 0.05. In addition, some of the fluorine may reach the first gate dielectric 101 and cause a small amount of re-growth of the first gate dielectric 101. Introducing fluorine or increasing the fluorine concentration in the gate dielectrics 100 (e.g., the second gate dielectric layer 103) allows for tuning of the threshold or breakdown voltage of the gate structure. However, an excessive amount of fluorine in the gate dielectrics 100, such as a fluorine to hafnium ratio of greater than about 0.05 in the second gate dielectric 103, may result in a capacitance equivalent thickness (CET) penalty (e.g., excessive re-growth) in the first gate dielectric 101. Further, the anneal process 200 may result in metal from the protective material 140 (e.g., titanium) and/or metal from the fluorine-containing layer 144 (e.g., tungsten) reaching the gate dielectrics 100. For example, the second gate dielectric 103 may have an atomic concentration of titanium of between about 0.1% and about 5% and an atomic concentration of tungsten of between about 0.1% and about 5%. Titanium and/or tungsten reaching the second gate dielectric 103 may result in additional fluorine moving into the first gate dielectric 101. Keeping each of these concentrations below 5% in the second gate dielectric 103 reduces the CET that may be caused by those metals and maintains the desired quality and effective oxide thickness of the gate dielectrics 100.

Figure 21B:
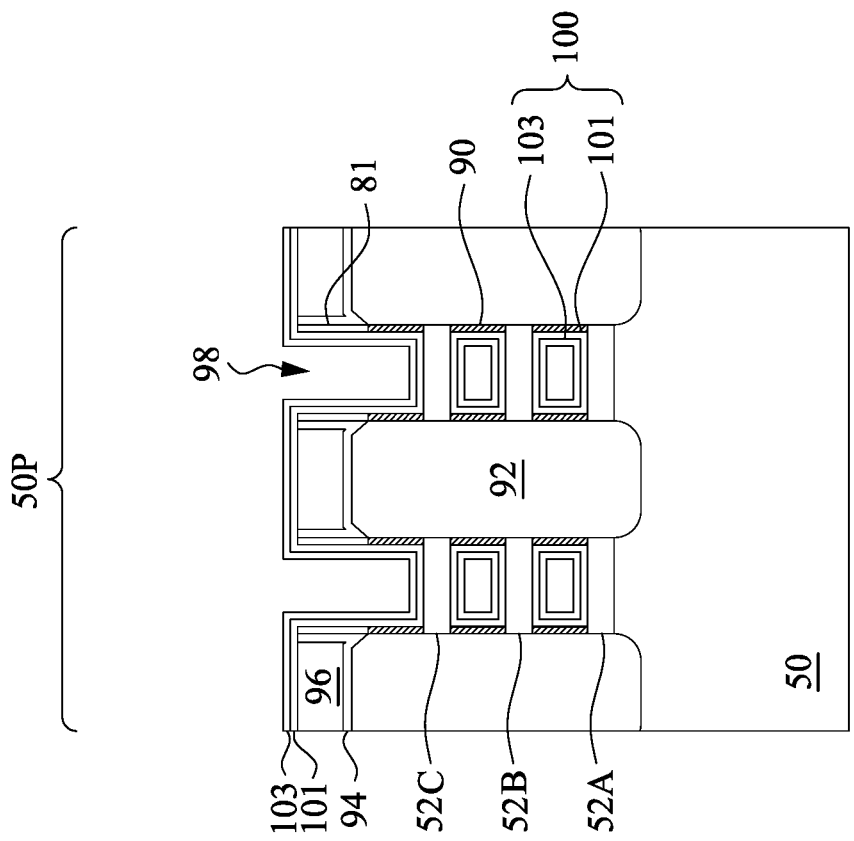
Figure 21A:
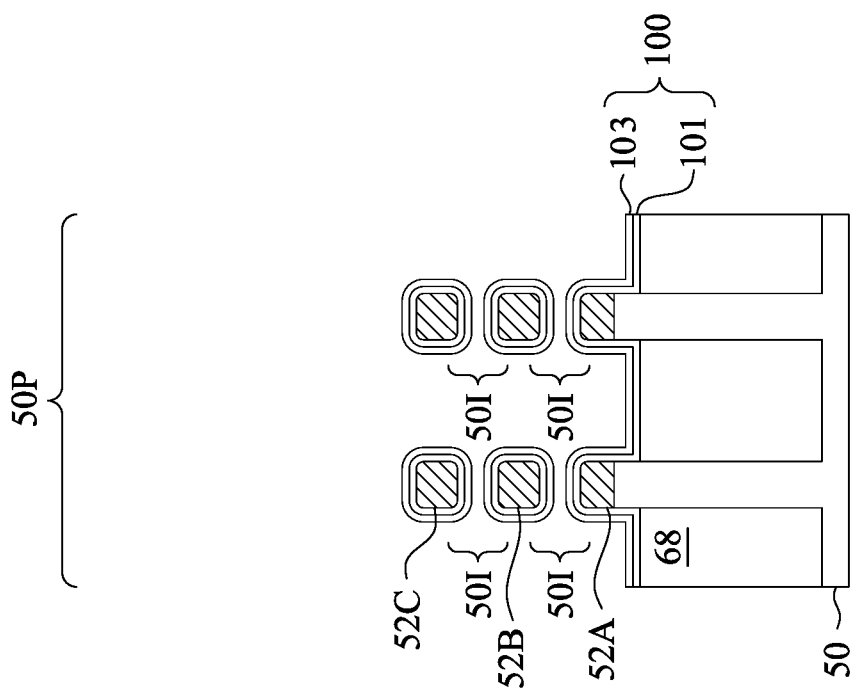

In FIGS. 21A and 21B, the fluorine-containing layer 144 and the protective material 140 are removed using an etch process to expose the second gate dielectric 103. For example, the etch process may be an isotropic wet etch using $HCl$, $H_2O_2$, $H_2O$, the like, combinations thereof, or any suitable materials as etchants. In accordance with some embodiments, the combination of etchants comprising $HCl$, $H_2O_2$, and $H_2O$ may be used to remove both the fluorine-containing layer 144 and the protective material 140. In other embodiments, an etch processes and a combination of etchants may be used to remove the fluorine-containing layer 144 while another etch process and/or combination of etchants may be used to remove the protective material 140.

Figure 22B:
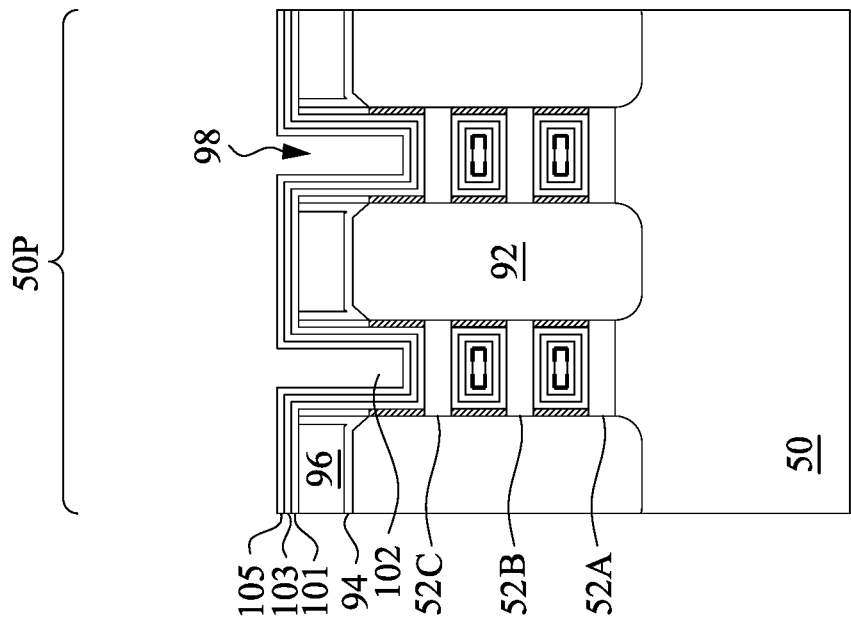
Figure 22A:
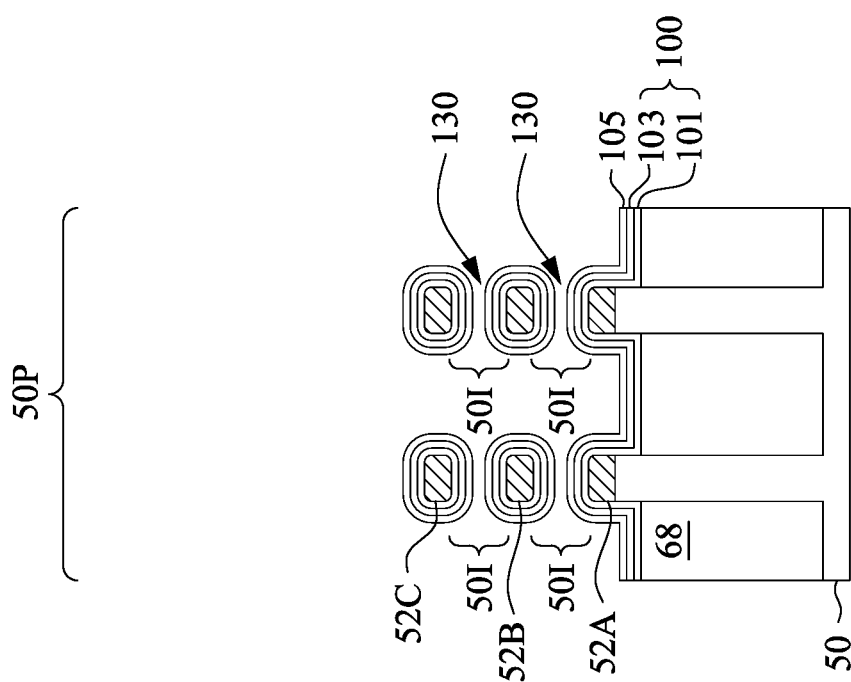

In FIGS. 22A and 22B, a first conductive material 105 of the gate electrodes 102 is deposited conformally over the gate dielectrics 100. In some embodiments, the first conductive material 105 is a p-type WFM layer comprising titanium nitride, tantalum nitride, titanium silicon nitride, or the like. The first conductive material 105 may be deposited by CVD, ALD, PECVD, PVD, or the like. The first conductive material 105 may be deposited to surround each of the first nanostructures 52. In some embodiments, the first conductive material 105 may only partially fill the regions 50I. As such, after the first conductive material 105 is deposited, openings 130 may remain in the regions 50I between the first nanostructures 52. In other embodiments, the first conductive material 105 may completely fill remaining portions of the regions 50I.

Although not specifically illustrated, the fluorine treatment may be performed without forming the protective material 140. For example, before performing the fluorine treatment, the first conductive material 105 may be formed on the second gate dielectric 103. Afterward, to perform the fluorine treatment, the fluorine-containing layer 144 is formed over the first conductive material 105 (e.g., using the deposition process or the soak process), and the anneal process 200 is performed to diffuse fluorine from the fluorine-containing layer 144 through the first conductive material 105 and into the gate dielectrics 100 as described above. The subsequent etch process (e.g., as described above) may be used to remove the fluorine-containing layer 144 while the first conductive material 105 remains intact. In some embodiments, the etch process may continue beyond the fluorine-containing layer 144 to remove a portion of the first conductive material 105, for example, in order to reduce the first conductive material 105 to a desired thickness.

In other embodiments, the fluorine treatment may be performed on the second gate dielectric 103 without first forming the protective material 140 or the first conductive material 105. For example, the fluorine-containing layer 144 may be formed using the deposition process or the soak process described above. However, without the protective material 140 present, the fluorine-containing precursor used in the formation of the fluorine-containing layer 144 may etch the second gate dielectric 103 by up to about 2 Å. As a result, using the deposition process will deposit the fluorine-containing layer 144 over the second gate dielectric 103, while using the soak process will convert an upper portion of the second gate dielectric 103 to the fluorine-containing layer 144. The anneal process 200 is then performed to diffuse fluorine from the fluorine-containing layer 144 directly into the gate dielectrics 100. As such, the anneal process 200 may be performed at milder conditions, such as at temperatures of between about 150° C. and about 700° C., at pressures of between about 0.1 Torr and about 50 Torr, and for a duration of between about 0.1 seconds and about 60 minutes. Following the anneal process 200, the fluorine-containing layer 144 is removed (e.g., in the manner described above) to expose the second gate dielectric 103.

Figure 23B:
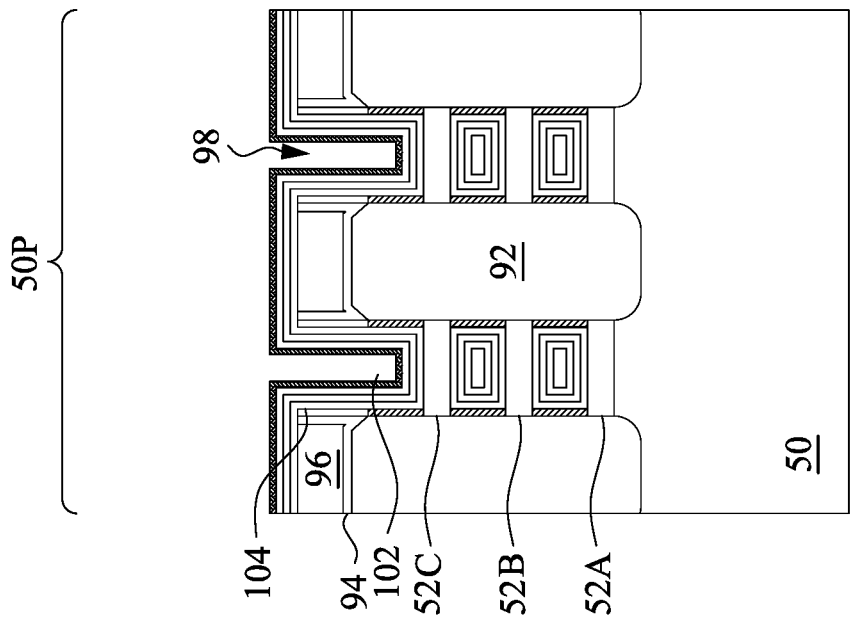
Figure 23A:
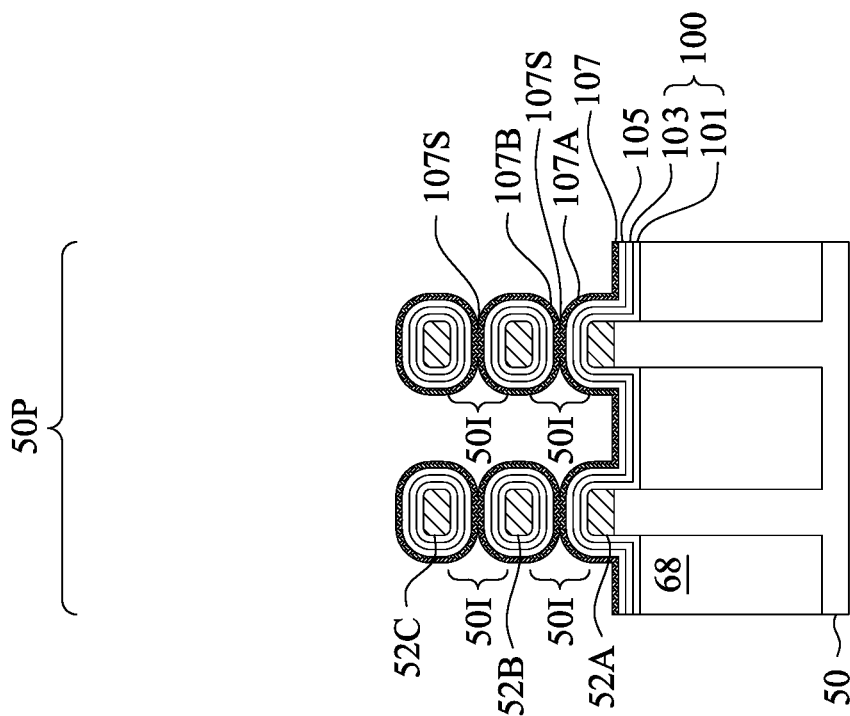

In FIGS. 23A and 23B, a second conductive material 107 is deposited conformally on the first conductive material 105. In some embodiments, the second conductive material 107 is a p-type WFM, comprising titanium nitride, tantalum nitride, tungsten nitride, molybdenum nitride, or the like. The second conductive material 107 may be deposited by CVD, ALD, PECVD, PVD, or the like.

The second conductive material 107 may fill any remaining portions of the regions 50I between the first nanostructures 52 (e.g., filling the openings 130). For example, the second conductive material 107 may be deposited on the first conductive material 105 until it merges and seams together, and in some embodiments, an interface 107S may be formed by a first portion 107A of the second conductive material 107 (e.g., conductive material 107A) touching a second portion 107B of the second conductive material 107 (e.g., conductive material 107B) in the region 50J.

Figure 24B:
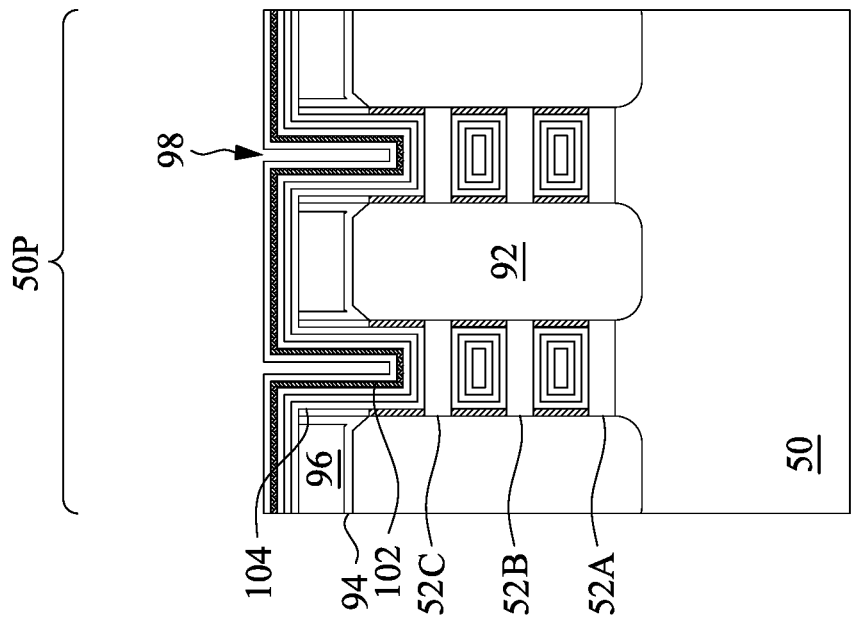
Figure 24A:
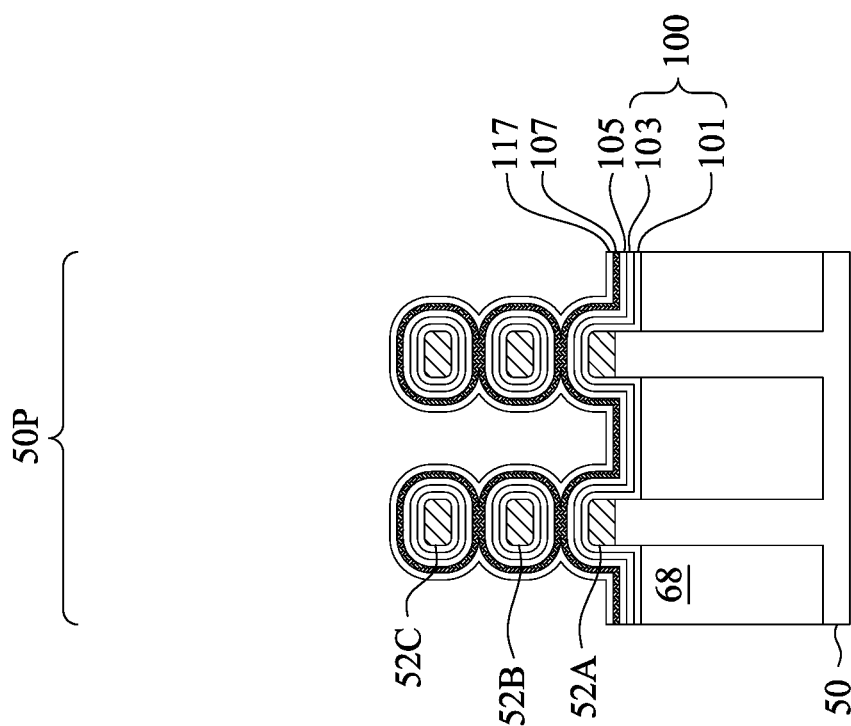

In FIGS. 24A and 24B, an adhesion layer 117 is deposited conformally over the second conductive material 107. In some embodiments, the adhesion layer 117 is deposited conformally on the second conductive material 107 in the p-type region 50P. In some embodiments, the adhesion layer 117 comprises titanium nitride, tantalum nitride, or the like. The adhesion layer 117 may be deposited by CVD, ALD, PECVD, PVD, or the like. The adhesion layer 117 may alternately be referred to as a glue layer and improves adhesion between the second conductive material 107 and the overlying fill metal 119, for example.

Figure 25B:
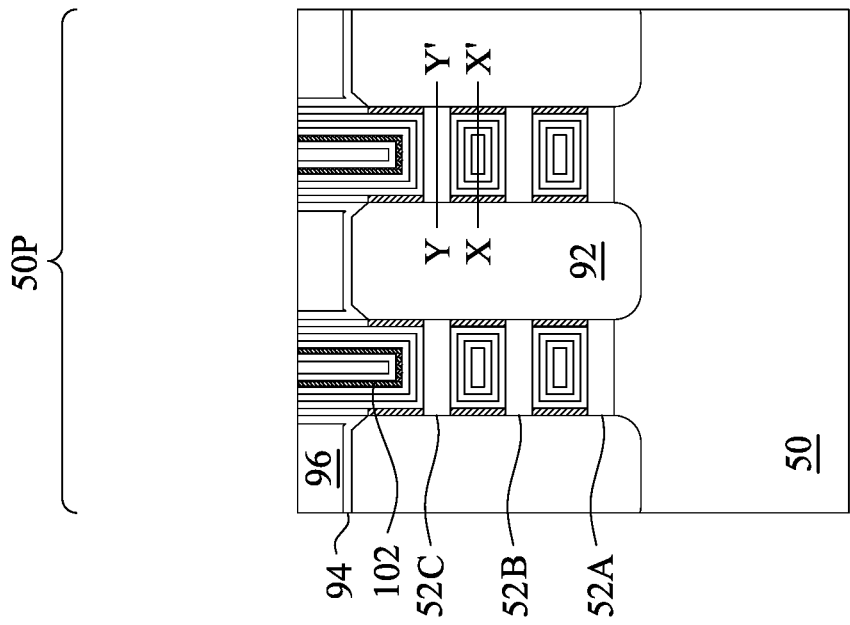
Figure 25A:
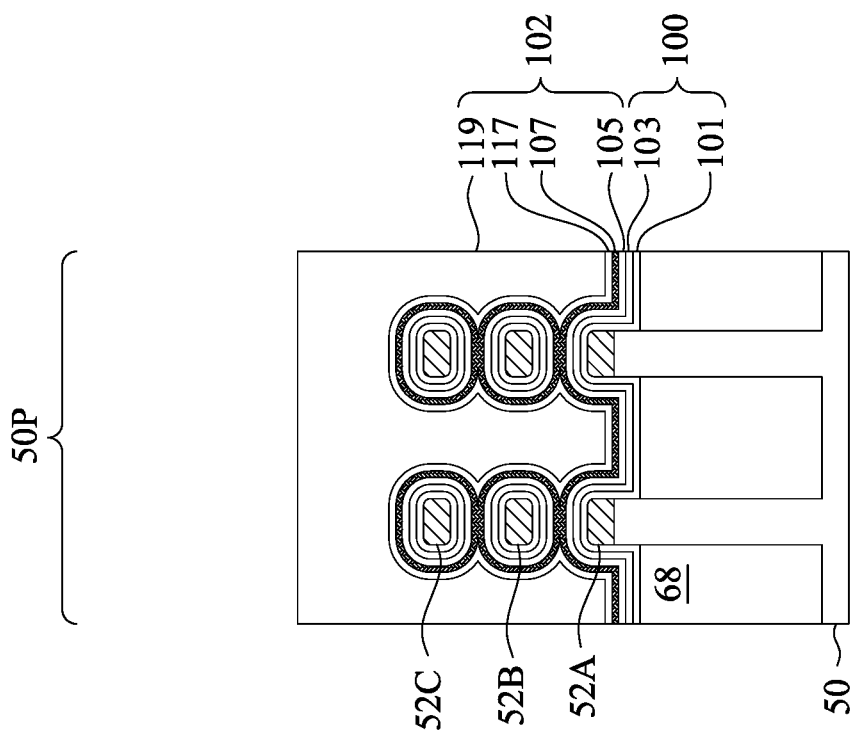
Figure 25D:
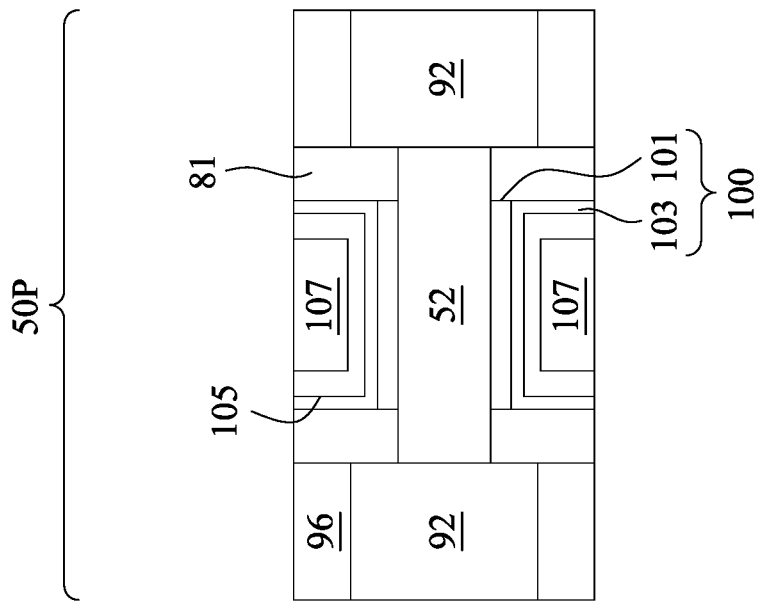
Figure 25C:
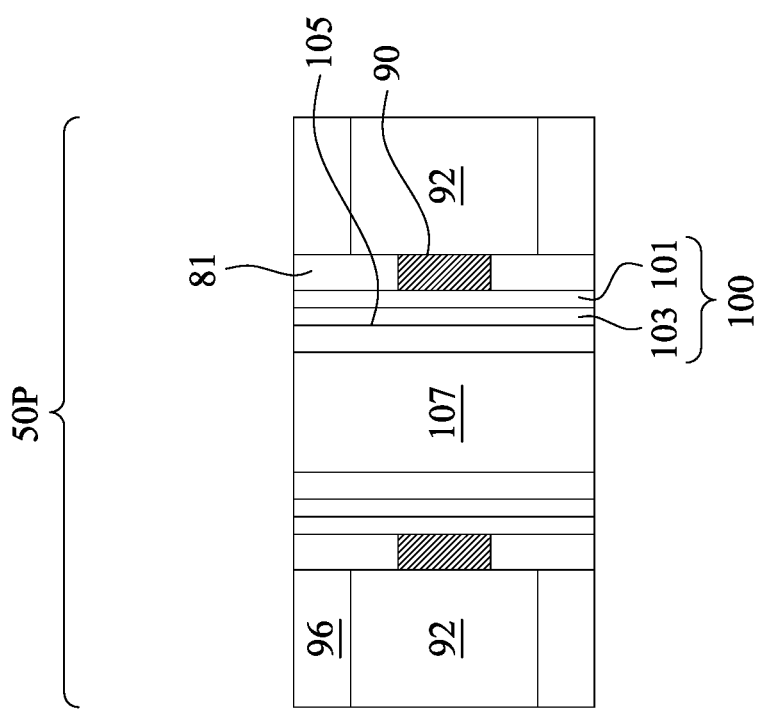

In FIGS. 25A-25D, remaining portions of the gate electrodes 102 are deposited to fill the remaining portions of the second recesses 98. For example, a fill metal 119 may be deposited over the adhesion layer 117. In some embodiments, the fill metal 119 comprises cobalt, ruthenium, aluminum, tungsten, combinations thereof, or the like, which is deposited by CVD, ALD, PECVD, PVD, or the like. The resulting gate electrodes 102 are formed for replacement gates and may comprise the first conductive material 105, the second conductive material 107, the adhesion layer 117, and the fill metal 119. FIG. 25C illustrates a top-down view along line X-X' of FIG. 25B (e.g., in the regions 50I) while FIG. 25D illustrates a top-down view along line Y-Y' of FIG. 25B (e.g., through one of the first nanostructures 52).

In the p-type region 50P, the gate dielectrics 100, the first conductive material 105, the second conductive material 107, the adhesion layer 117, and the fill metal 119 may each be formed on top surfaces, sidewalls, and bottom surfaces of the first nanostructures 52. The gate dielectrics 100, the first conductive material 105, the second conductive material 107, the adhesion layer 117, and the fill metal 119 may also be deposited on top surfaces of the first ILD 96, the CESL 94, the first spacers 81, and the STI regions 68. After filling the second recesses 98, a planarization process, such as a CMP, may be performed to remove the excess portions of the gate dielectrics 100, the first conductive material 105, the second conductive material 107, the adhesion layer 117, and the fill metal 119, which excess portions are over the top surface of the first ILD 96. The remaining portions of material of the gate electrodes 102 and the gate dielectrics 100 thus form the replacement gate structures of the resulting nano-FETs. The gate electrodes 102 and the gate dielectrics 100 may be collectively referred to as "gate structures."

Figures 26A, 26B:
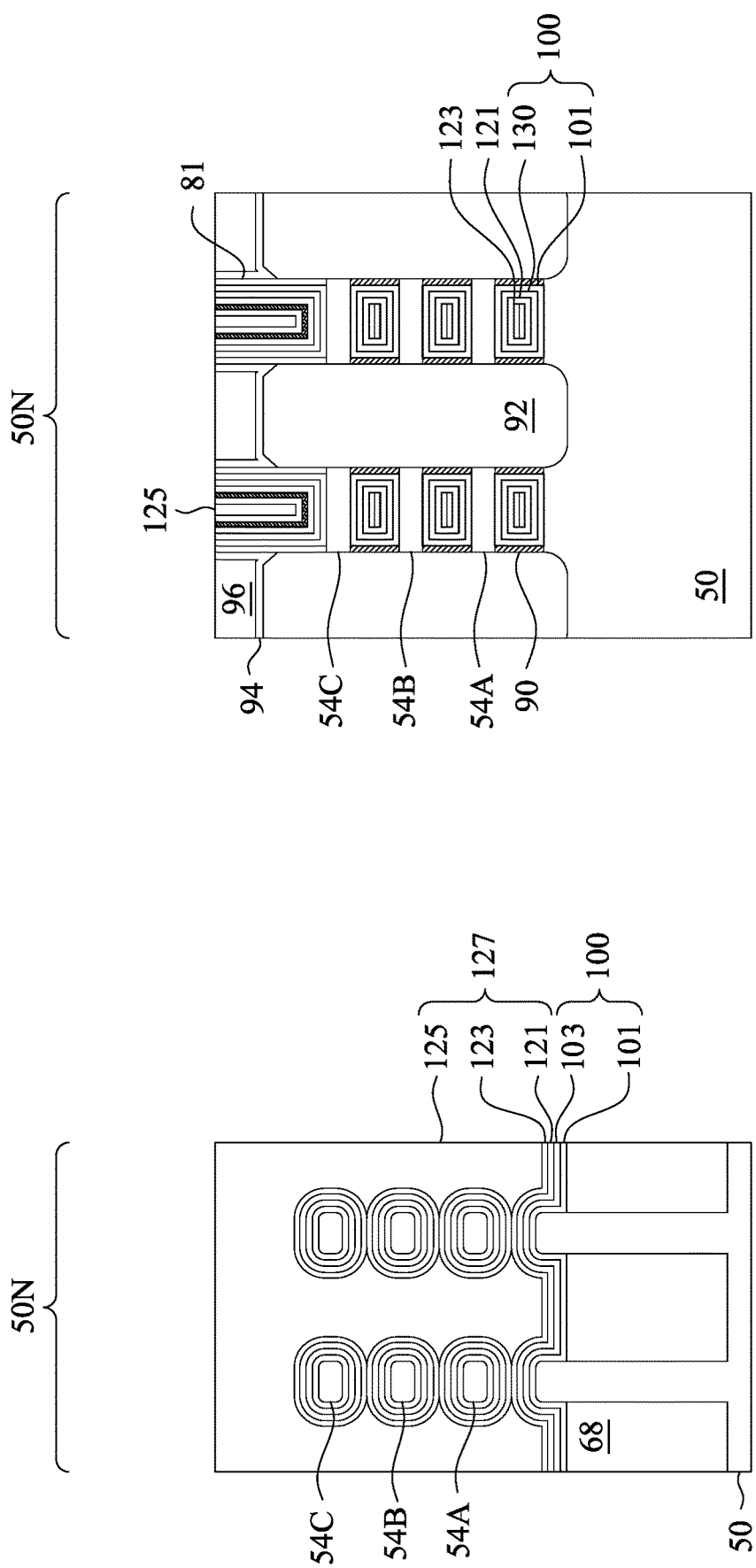

FIGS. 26A and 26B illustrate a gate stack in the n-type region 50N. Forming the gate stack in the n-type region 50N may include first removing the first nanostructures 52 in the n-type region 50N. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, and the STI regions 68 remain relatively unetched as compared to the first nanostructures 52. In embodiments in which the first nanostructures 52A-52C include, e.g., SiGe, and the second nanostructures 54A-54C include, e.g., Si or SiC, tetramethylammonium hydroxide (TMAH), ammonium hydroxide ($NH_4OH$) or the like may be used to remove the first nanostructures 52 in the n-type region 50N.

The gate stack is then formed over and around the second nanostructures 54 in the n-type region 50N. The gate stack includes the gate dielectrics 100 and gate electrodes 127. In some embodiments, the gate dielectrics 100 in the n-type region 50N and the p-type region 50P may be formed simultaneously, and the fluorine treatment may be performed simultaneously as well. Further, at least portions of the gate electrodes 127 may be formed either before or after forming the gate electrodes 102 (see FIGS. 25A-25D), such as while the p-type region 50P is masked. As such, the gate electrodes 127 may comprise different materials than the gate electrodes 102. For example, the gate electrodes 127 may comprise a third conductive material 121, a barrier layer 123, and a fill metal 125. The third conductive material 121 may be an n-type WFM layer comprising an n-type metal, such as, titanium aluminum, titanium aluminum carbide, tantalum aluminum, tantalum carbide, combinations thereof, or the like. The third conductive material 121 may be deposited by CVD, ALD, PECVD, PVD, or the like. The barrier layer 123 may comprise titanium nitride, tantalum nitride, tungsten carbide, combinations thereof, or the like, and the barrier layer 123 may further function as an adhesion layer. The barrier layer 123 may be deposited by CVD, ALD, PECVD, PVD, or the like. The fill metal 125 may comprise cobalt, ruthenium, aluminum, tungsten, combinations thereof, or the like, which is deposited by CVD, ALD, PECVD, PVD, or the like. The fill metal 125 may or may not have a same material composition and be deposited concurrently with the fill metal 119.

Although not specifically illustrated, the fluorine treatment may be performed in the n-type region 50N without forming the protective material 140, similarly as described above with respect to the p-type region 50P. For example, before performing the fluorine treatment, the third conductive material 121 may be formed on the second gate dielectric 103. Afterward, the fluorine-containing layer 144 is formed, the anneal process 200 is performed, and the fluorine-containing layer 144 is removed, while the third conductive material 121 remains intact. In another embodiment, before performing the fluorine treatment, the first conductive material 105 (instead of the third conductive material 121) is formed simultaneously in both the n-type region 50N and the p-type region SoP. The fluorine treatment may then be performed simultaneously in both regions. During removal of the fluorine-containing layer 144 in the n-type region 50N, the first conductive material 105 may also be removed or may at least partially remain intact. The third conductive material 121 and the remaining portions of the gate electrode 127 may then be formed over the structure.

In other embodiments, the fluorine treatment may be performed on the second gate dielectric 103 without first forming the protective material 140, the first conductive material 105, or the third conductive material 121, similarly as described above with respect to the p-type region 50P. Following the fluorine treatment and removal of the fluorine-containing layer 144, the third conductive material 121 may be formed on the second gate dielectric 103.

In accordance with some embodiments, the gate dielectrics 100 in the n-type region 50N may be formed simultaneously with the gate dielectrics 100 in the p-type region. The fluorine treatment (e.g., depositing the protective material 140, forming the fluorine-containing layer 144, performing the anneal process, and removing the fluorine-containing layer 144 and the protective material 140) may also be performed simultaneously in both regions. After the fluorine treatment, portions of the gate stacks may be continued in both regions or, alternatively, one of the regions may be masked while the rest of the gate stack is formed in the other region, as described above.

In accordance with other embodiments, such as when the gate dielectrics 100 in the regions (e.g., the p-type region 50P and the n-type region 50N) are formed separately or when the gate dielectrics 100 will have different compositions or specifications, the fluorine treatment may also be performed separately. For example, the gate dielectrics 100 in each of the regions may be formed simultaneously, and then one of the regions is masked to perform the fluorine treatment and complete the gate stack for the other region. Any suitable combination of these methods to form some or all of the gate stacks in each region may be utilized, and all such combinations are fully intended to be included within the scope of the embodiments.

Still referring to FIGS. 26A and 26B, after filling the second recesses 98 in the n-type region 50N, a planarization process, such as a CMP, may be performed to remove the excess portions of the gate dielectrics 100 and the gate electrodes 127, which excess portions are over the top surface of the first ILD 96. The remaining portions of material of the gate electrodes 127 and the gate dielectrics 100 thus form replacement gate structures of the resulting nano-FETs of the n-type region 50N. The CMP processes to remove excess materials of the gate electrodes 102 in the p-type region 50P and to remove excess materials of the gate electrodes 127 in the n-type region 50N may be performed concurrently or separately.

Figure 27C:
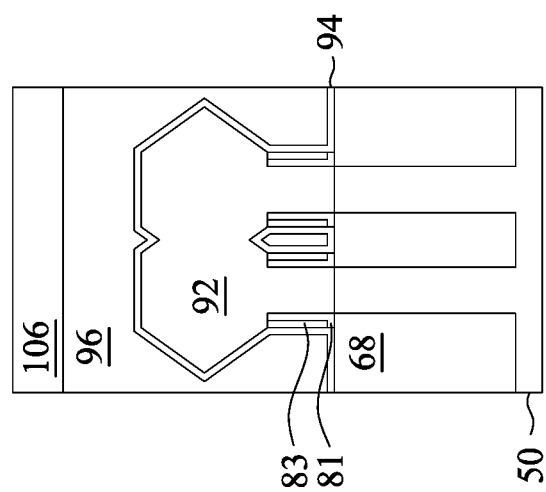

In FIGS. 27A-27C, the gate structures (e.g., the gate electrodes 102, and the gate electrodes 127) are recessed, so that a recess is formed directly over the gate structure and between opposing portions of the first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the gate contacts 114, discussed below with respect to FIGS. 29A-29C) penetrate through the gate mask 104 to contact the top surface of the recessed gate electrodes 102/127.

As further illustrated by FIGS. 27A-27C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

In FIGS. 28A-28C, the second ILD 106, the first ILD 96, the CESL 94, and the gate masks 104 are etched to form third recesses 108 exposing surfaces of the epitaxial source/drain regions 92 and/or the gate structure. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structure, and a bottom of the third recesses 108 may be level with (e.g., at a same level, or having a same distance from the substrate), or lower than (e.g., closer to the substrate) top surfaces of the epitaxial source/drain regions 92 and/or the gate structure.

Although FIG. 28B illustrates the third recesses 108 as exposing the epitaxial source/drain regions 92 and the gate structure in a same cross-section, in various embodiments, the epitaxial source/drain regions 92 and the gate structure may be exposed in different cross-sections, thereby reducing the risk of shorting subsequently formed contacts.

After the third recesses 108 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although the silicide regions 110 are referred to as silicide regions, the silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Figure 29B:
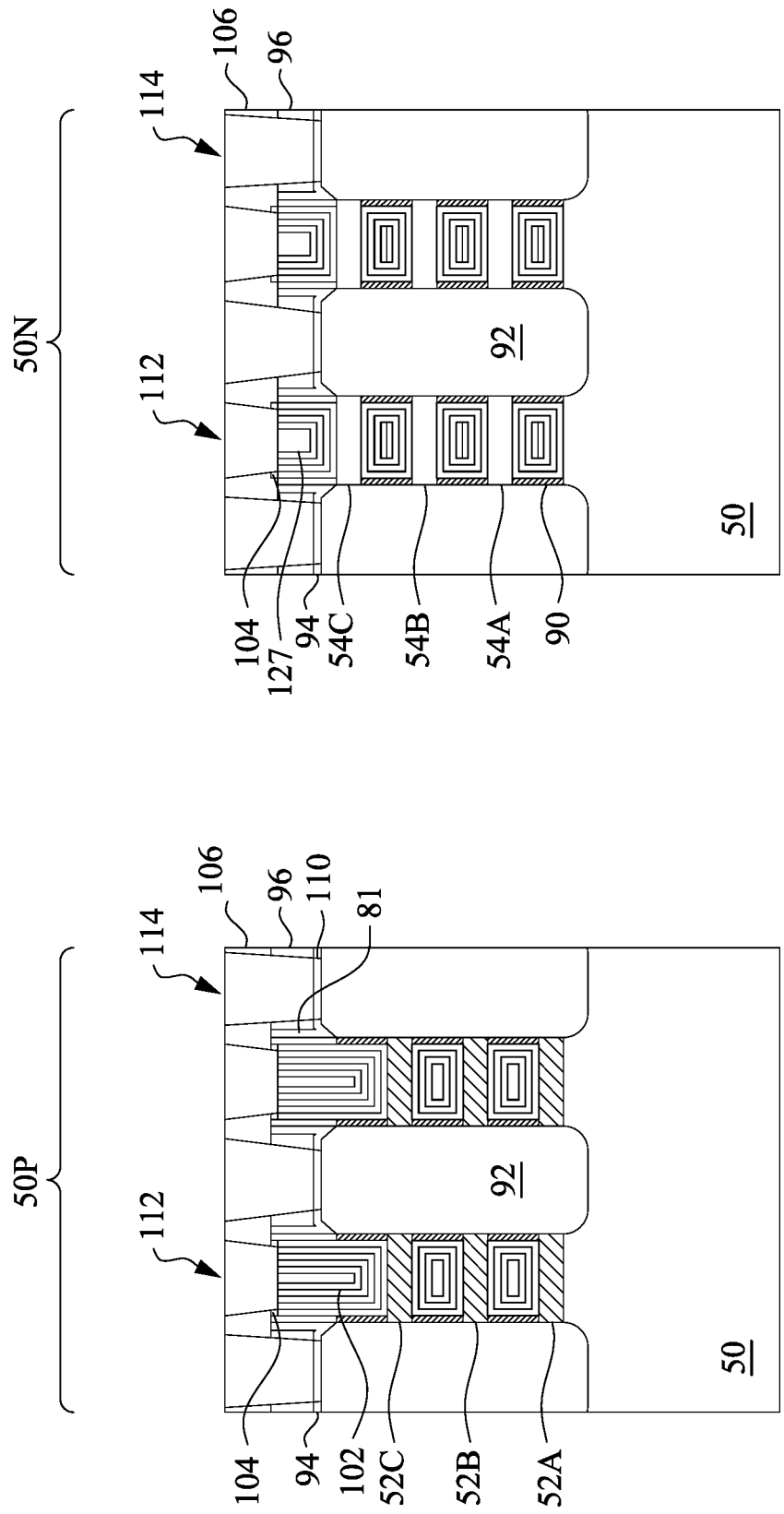
Figure 29C:
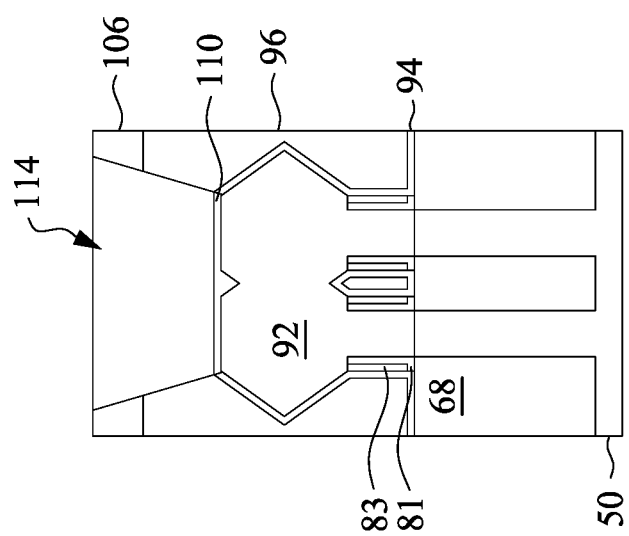

Next, in FIGS. 29A-29C, contacts 112 and 114 (may also be referred to as contact plugs) are formed in the third recesses 108. The contacts 112 and 114 may each comprise one or more layers, such as barrier layers, diffusion layers, and fill materials. For example, in some embodiments, the contacts 112 and 114 each include a barrier layer and a conductive material, and are electrically coupled to the underlying conductive feature (e.g., the gate electrodes 102, the gate electrodes 127, and/or silicide region 110 in the illustrated embodiment). The contacts 114 are electrically coupled to the gate electrodes 102 and 127 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

FIGS. 30A-30C illustrate cross-sectional views of a device according to some other embodiments. FIG. 30A illustrates reference cross-section A-A' illustrated in FIG. 1. FIG. 30B illustrates reference cross-section B-B' illustrated in FIG. 1. FIG. 30C illustrates reference cross-section C-C' illustrated in FIG. 1. Like reference numerals indicate like elements formed by like processes as discussed in embodiments above, such as the structure of FIGS. 29A-29C. However, in FIGS. 30A-30C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure may be formed, for example, by removing the first nanostructures 52 from both the p-type region 50P and the n-type region 50N simultaneously; depositing the gate dielectrics 100 and the gate electrodes 102 around the second nanostructures 54 in the p-type region 50P; and depositing the gate dielectrics 100 and the gate electrodes 127 around the second nanostructures 54 in the n-type region 50N. Alternatively, the second nanostructures 54 may be removed from both the p-type region 50P and the n-type region 50N, and the first nanostructures 52 may provide the channel regions for both the p-type nano-FETs in the p-type region 50P and the n-type nano-FETs in the n-type region 50N.

Advantages may be achieved. Various embodiments provide gate stacks having fluorine treated gate dielectrics to increase the yield and improve reliability and mobility related to the gate dielectrics. In particular, the fluorine treatment diffuses fluorine into the gate dielectrics to fill vacancies, to attach to dangling bonds, and to achieve a desired effective oxide thickness. For example, a protective material is first formed over the gate dielectrics to protect the gate dielectrics (e.g., the high-k gate dielectric) from being etched during the fluorine treatment. The fluorine treatment begins with either a deposition process or a soak process to form a fluorine-containing layer over the protective material. An anneal process is then performed to drive or diffuse some of the fluorine from the fluorine-containing layer through the protective material and into the gate dielectrics. The fluorine-containing layer and the protective material are then removed, and remaining layers of the gate stack (e.g., layers of the gate electrode) are formed. In some embodiments, only the fluorine-containing layer is fully removed, while all or part of the protective material remains to part of the gate electrode. The embodiments result in desired amounts of fluorine diffusing into the gate dielectrics, thereby achieving the benefits of increased yield and improved device performance.

In some embodiments, a method includes forming a plurality of nanostructures over a substrate; etching the plurality of nanostructures to form recesses; forming source/drain regions in the recesses; removing first nanostructures of the plurality of nanostructures leaving second nanostructures of the plurality of nanostructures; depositing a gate dielectric over and around the second nanostructures; depositing a protective material over the gate dielectric; performing a fluorine treatment on the protective material; removing the protective material; depositing a first conductive material over the gate dielectric; and depositing a second conductive material over the first conductive material. In another embodiment, performing the fluorine treatment comprises forming a fluorine-containing layer over the protective material. In another embodiment, forming the fluorine-containing layer over the protective material comprises converting an upper portion of the protective material to the fluorine-containing layer. In another embodiment, performing the fluorine treatment further comprises performing an anneal process on the fluorine-containing layer. In another embodiment, performing the anneal process comprises diffusing fluorine from the fluorine-containing layer into the gate dielectric. In another embodiment, the method further includes removing the fluorine-containing layer. In another embodiment, the fluorine-containing layer further comprises tungsten. In another embodiment, performing the fluorine treatment comprises filling vacancies in the gate dielectric with fluorine.

In some embodiments, a method includes forming nanostructures over a substrate; forming a first dielectric layer over the substrate and around the nanostructures; forming a second dielectric layer over the first dielectric layer; depositing a first conductive material over the second dielectric layer; forming a fluorine-containing layer over the first conductive material; diffusing fluorine from the fluorine-containing layer into the second dielectric layer, wherein diffusing fluorine changes a breakdown voltage of the first dielectric layer and the second dielectric layer; removing the fluorine-containing layer; and forming a second conductive material over the second dielectric layer. In another embodiment, removing the fluorine-containing layer comprises removing a portion of the first conductive material. In another embodiment, before forming the second conductive material, the first conductive material is removed. In another embodiment, the second conductive material is further formed over the first conductive material. In another embodiment, the first conductive material comprises at least one of titanium nitride, tantalum nitride, and titanium silicon nitride. In another embodiment, diffusing fluorine comprises performing an anneal process, and wherein after diffusing fluorine the second dielectric layer comprises a fluorine-to-metal atomic ratio of between about 0.005 and about 0.05. In another embodiment, diffusing fluorine further comprises diffusing fluorine into the first dielectric layer, and wherein a first portion of fluorine fills vacancies in the second dielectric layer, and wherein a second portion of fluorine attaches to dangling silicon bonds at an interface between the substrate and the first dielectric layer.

In some embodiments, a method includes forming first nanostructures and second nanostructures over a substrate; removing the first nanostructures; forming a first gate dielectric around the second nanostructures; tuning a breakdown voltage of the first gate dielectric, the tuning the breakdown voltage comprising: forming a protective material over the first gate dielectric; forming a fluorine-containing layer over the protective material; diffusing fluorine from the fluorine-containing layer through the protective material and into the first gate dielectric; removing the protective material; and forming a first conductive material over the first gate dielectric. In another embodiment, forming the fluorine-containing layer comprises converting an upper portion of the protective material to the fluorine-containing layer. In another embodiment, the fluorine-containing layer further comprises tungsten. In another embodiment, diffusing fluorine from the fluorine-containing layer through the protective material comprises performing an anneal process, and wherein the first gate dielectric comprises a fluorine-to-metal ratio of between about 0.05 and about 0.005. In another embodiment, the method further includes, before forming the first gate dielectric, forming a second gate dielectric around the second nanostructures; and diffusing fluorine from the fluorine-containing layer through the protective material, through the first gate dielectric, and into the second gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first nanostructure, a sacrificial material, and a second nanostructure over a substrate;
    removing the sacrificial material to form an opening between the first nanostructure and the second nanostructure;
    depositing a first gate dielectric over the first nanostructure and a second gate dielectric over the second nanostructure;
    depositing a first protective material over the first gate dielectric and a second protective material over the second gate dielectric;
    flowing a fluorine-containing precursor and a reducing agent precursor over the first protective material and the second protective material;
    removing the first protective material and the second protective material to expose the first gate dielectric and the second gate dielectric;
    depositing a first conductive material over the first gate dielectric;
    depositing a second conductive material over the first conductive material;
    depositing a third conductive material over the second gate dielectric; and
    depositing a fourth conductive material over the third conductive material.

2. The method of claim 1, wherein the second conductive material is in physical contact with the first conductive material.

3. The method of claim 2, wherein the fourth conductive material is in physical contact with the third conductive material.

4. The method of claim 1, wherein both of the first protective material and the second protective material comprise a conductive nitride.

5. The method of claim 4, wherein the conductive nitride is titanium nitride.

6. The method of claim 1, wherein the first conductive material is a p-type work function metal layer, and wherein the third conductive material is an n-type work function metal layer.

7. The method of claim 1, wherein the fluorine-containing precursor comprises $WF_6$.

8. The method of claim 7, wherein after flowing the fluorine-containing precursor and the reducing agent precursor, a fluorine-containing layer is formed over the first protective material.

9. The method of claim 8, further comprising performing an anneal on the fluorine-containing layer.

10. A method, comprising:
    forming a semiconductor stack over a semiconductor substrate, the semiconductor stack comprising a first semiconductor layer and a second semiconductor layer, the first semiconductor layer and the second semiconductor layer being different materials;
    patterning the semiconductor stack and an upper portion of the semiconductor substrate to form a semiconductor fin;
    performing a first etch process to remove the first semiconductor layer, the semiconductor substrate and the second semiconductor layer being separated by an opening;
    forming a first dielectric layer along a first surface of the semiconductor substrate and a second dielectric layer along a second surface of the second semiconductor layer;
    forming a first conductive layer over the first dielectric layer and a second conductive layer over the second dielectric layer;
    forming a first fluorine layer over the first conductive layer and a second fluorine layer over the second conductive layer, the first fluorine layer and the second fluorine layer comprising tungsten;

performing a second etch process to remove the first fluorine layer, the second fluorine layer, the first conductive layer, and the second conductive layer; and forming a conductive stack in the opening over the first dielectric layer and the second dielectric layer.

11. The method of claim 10, wherein performing the second etch process comprises exposing the first dielectric layer and the second dielectric layer.

12. The method of claim 10, wherein etchants of the second etch process comprise HCl, $H_2O_2$, and $H_2O$.

13. The method of claim 10, wherein the first conductive layer and the second conductive layer comprise a metal nitride.

14. The method of claim 10, further comprising, before performing the first etch process:

etching a first recess and a second recess into the semiconductor stack and the semiconductor substrate;

forming a source region in the first recess and a drain region in the second recess;

forming a dummy gate structure over the semiconductor stack;

depositing a dielectric layer over the semiconductor stack and around the dummy gate structure; and performing a third etch process to remove at least a portion of the dummy gate structure.

15. The method of claim 14, wherein forming the conductive stack comprises:

forming a work function metal layer in the opening, the work function metal layer extending across the opening to be in physical contact with the first dielectric layer and the second dielectric layer; and forming a fill metal over the work function metal layer.

16. A method, comprising:

forming a fin over a semiconductor substrate;

forming a source region and a drain region in the fin;

forming a dummy gate structure over and across the fin;

etching a portion of the dummy gate structure to expose the fin;

etching a first portion of the fin to form an opening between the fin and the semiconductor substrate, a second portion of the fin remaining and extending from the source region to the drain region;

depositing a metal dielectric material over the semiconductor substrate and the second portion of the fin, the metal dielectric material comprising a first metal;

depositing a conductive material over the metal dielectric material, the conductive material comprising a second metal;

depositing a metal fluoride material over the conductive material, the metal fluoride material comprising a third metal;

etching the metal fluoride material to expose the conductive material;

etching the conductive material to expose the metal dielectric material; and after etching the conductive material, depositing a plurality of conductive layers over the metal dielectric material.

17. The method of claim 16, further comprising, after depositing the metal fluoride material, performing an anneal process.

18. The method of claim 17, wherein performing the anneal process increases a fluorine concentration in the metal dielectric material.

19. The method of claim 17, wherein after performing the anneal process, an atomic ratio of fluorine to the first metal in the metal dielectric material is greater than about 0.05.

20. The method of claim 17, wherein after performing the anneal process, an atomic concentration of the second metal in the metal dielectric material is between about 0.1% and 5%.

* * * * *